US009246133B2

(12) United States Patent
Yamazaki et al.

(10) Patent No.: US 9,246,133 B2
(45) Date of Patent: Jan. 26, 2016

(54) LIGHT-EMITTING MODULE, LIGHT-EMITTING PANEL, AND LIGHT-EMITTING DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Hisao Ikeda, Kanagawa (JP); Masataka Nakada, Tochigi (JP); Masami Jintyou, Tochigi (JP); Koji Ono, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/242,993

(22) Filed: Apr. 2, 2014

(65) Prior Publication Data

US 2014/0306201 A1 Oct. 16, 2014

(30) Foreign Application Priority Data

Apr. 12, 2013 (JP) ................... 2013-083512

(51) Int. Cl.
*H01L 27/32* (2006.01)
*H01L 51/52* (2006.01)
(52) U.S. Cl.
CPC ........ *H01L 51/5271* (2013.01); *H01L 27/3246* (2013.01); *H01L 51/5218* (2013.01); *H01L 2251/5315* (2013.01)
(58) Field of Classification Search
CPC .................. H01L 51/5271; H01L 2251/5315; H01L 27/32; H01L 27/3244; H01L 27/3246; H01L 51/5218; H01L 51/5237; H01L 51/5275; H01L 51/5281; H01L 2251/5353; H01L 27/3211; H01L 27/322; H01L 27/3248; H01L 27/3258; H01L 27/3265; H01L 27/3283
See application file for complete search history.

(56) References Cited

U.S. PATENT DOCUMENTS

| | | | | |
|---|---|---|---|---|
| 5,265,177 A | * | 11/1993 | Cho .................... | G02B 6/42 385/131 |
| 5,685,949 A | * | 11/1997 | Yashima ........... | H01J 37/32082 134/1.1 |
| 5,812,403 A | * | 9/1998 | Fong .................. | B08B 7/0035 134/1.1 |
| 6,384,427 B1 | | 5/2002 | Yamazaki et al. | |
| 6,433,487 B1 | | 8/2002 | Yamazaki | |
| 6,798,132 B2 | | 9/2004 | Satake | |

(Continued)

FOREIGN PATENT DOCUMENTS

| | | |
|---|---|---|
| JP | 2003-017273 A | 1/2003 |
| JP | 2013-038069 A | 2/2013 |

*Primary Examiner* — Stephen W Smoot
*Assistant Examiner* — Edward Chin
(74) *Attorney, Agent, or Firm* — Nixon Peabody LLP; Jeffrey L. Costellia

(57) ABSTRACT

One embodiment of the present invention relates to a light-emitting device comprising an insulating surface; a lower electrode over the insulating surface; a protrusion over the insulating surface having a sidewall sloping toward the lower electrode; a light-transmitting partition overlapping with an end portion of the lower electrode and the sidewall of the protrusion; and a light-emitting element including the lower electrode, an upper electrode overlapping with the lower electrode, and a layer containing a light-emitting organic compound between the lower electrode and the upper electrode. In the light-emitting device, the sidewall of the protrusion can reflect light emitted from the light-emitting element. As a result, the light-emitting device that has reduced power consumption is provided.

20 Claims, 15 Drawing Sheets

(56) References Cited

U.S. PATENT DOCUMENTS

| | | | |
|---|---|---|---|
| 6,958,490 B2 | 10/2005 | Okamoto et al. | |
| 7,030,556 B2* | 4/2006 | Adachi | H01L 27/3246 313/110 |
| 7,342,355 B2 | 3/2008 | Seo et al. | |
| 7,402,948 B2 | 7/2008 | Yamazaki et al. | |
| 7,897,971 B2* | 3/2011 | Kurokawa | H01L 27/0248 257/57 |
| 7,897,979 B2 | 3/2011 | Yamazaki et al. | |
| 8,067,775 B2* | 11/2011 | Miyairi | H01L 27/1225 257/72 |
| 8,227,278 B2* | 7/2012 | Sasagawa | H01L 27/1214 257/E21.414 |
| 8,366,953 B2* | 2/2013 | Kohno | C23C 16/4405 216/37 |
| 8,384,079 B2* | 2/2013 | Yamazaki | G02F 1/136227 257/43 |
| 2001/0054867 A1 | 12/2001 | Kubota | |
| 2003/0221779 A1* | 12/2003 | Okuda | C23C 16/4405 156/345.26 |
| 2004/0160165 A1* | 8/2004 | Yamauchi | H01L 27/3246 313/498 |
| 2004/0233141 A1* | 11/2004 | Matsumoto | G09G 3/3266 345/76 |
| 2005/0252451 A1* | 11/2005 | Beppu | B08B 7/0035 118/719 |
| 2010/0127265 A1* | 5/2010 | Kim | H01L 29/41733 257/59 |
| 2013/0009194 A1 | 1/2013 | Yamazaki et al. | |
| 2013/0194528 A1* | 8/2013 | Wang | G02F 1/13306 349/43 |
| 2014/0319526 A1* | 10/2014 | Choi | H01L 29/41733 257/59 |

* cited by examiner

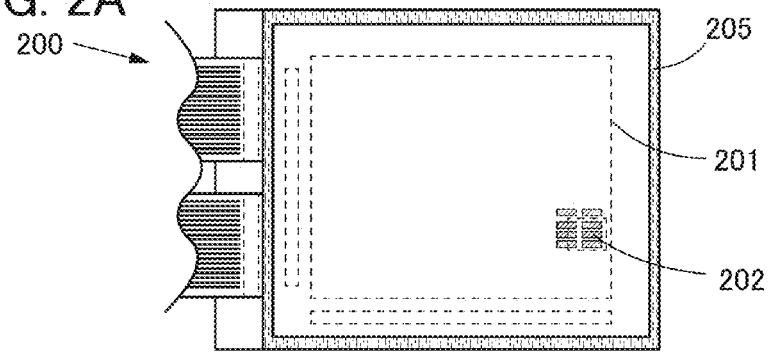
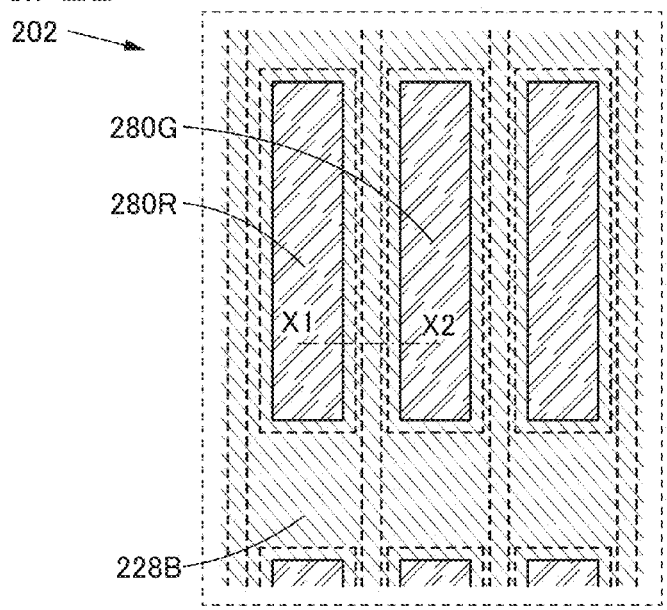
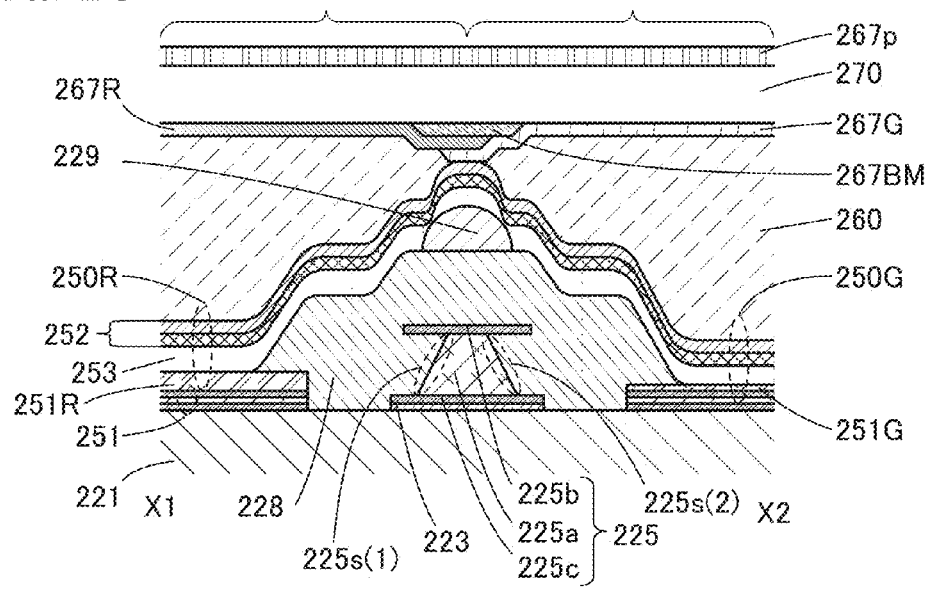

FIG. 6A1
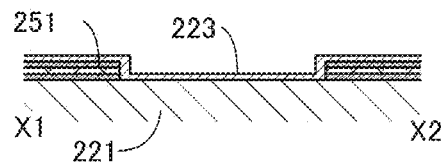
FIG. 6A2
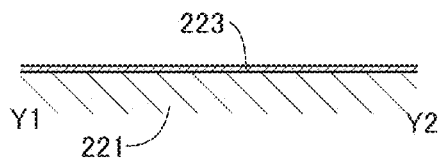
FIG. 6B1
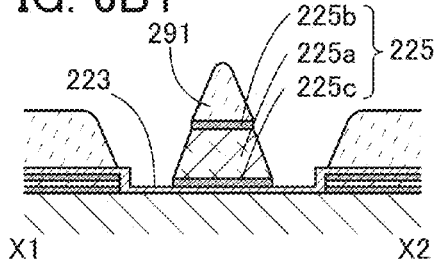
FIG. 6B2
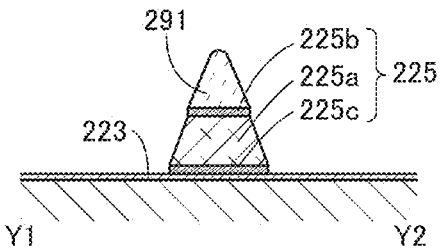
FIG. 6C1
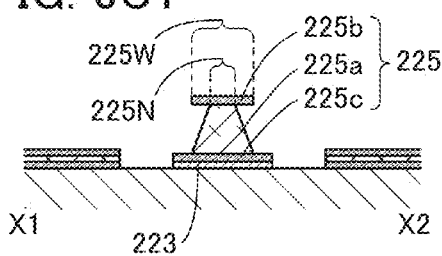
FIG. 6C2
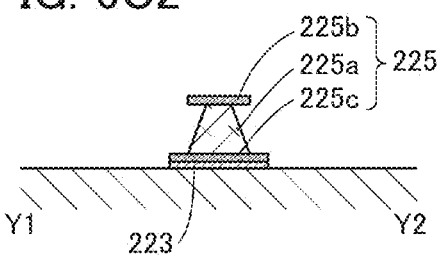
FIG. 6D1
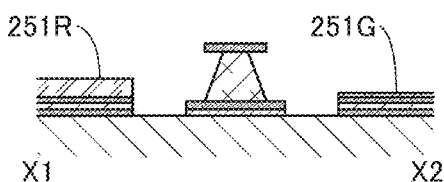
FIG. 6D2
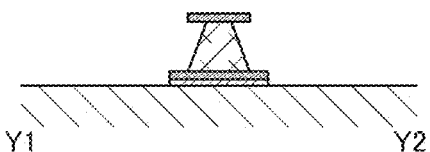
FIG. 6E1
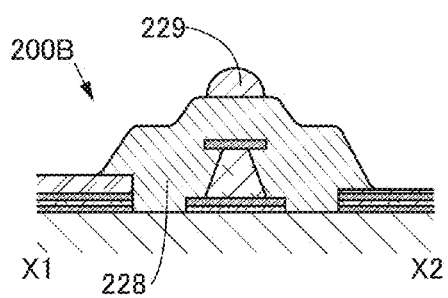
FIG. 6E2
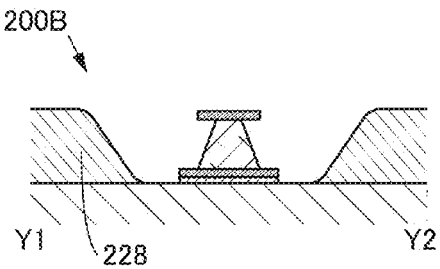

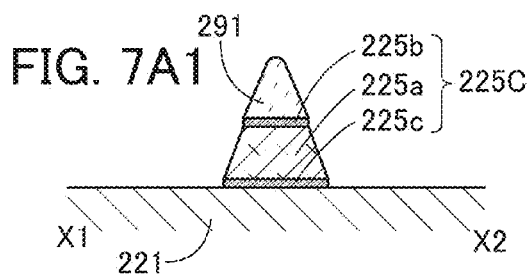
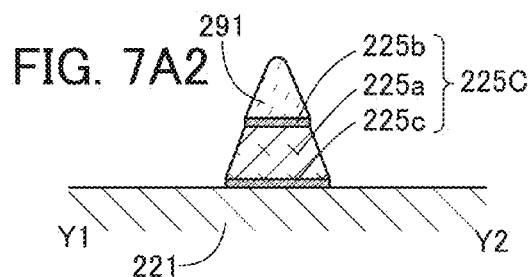
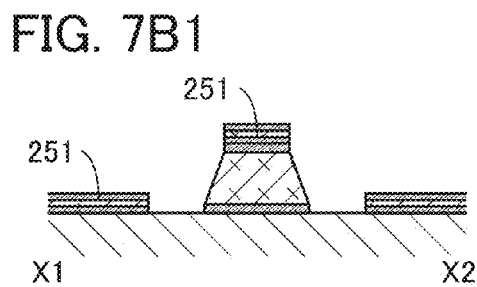
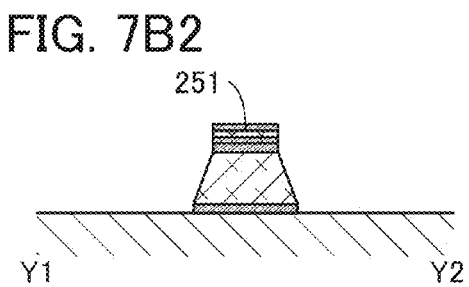
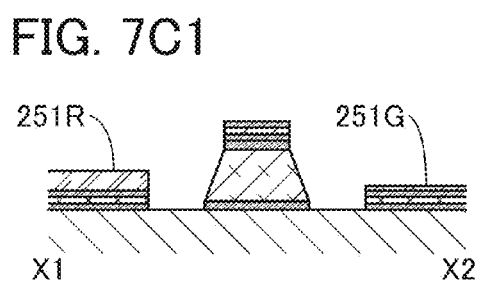
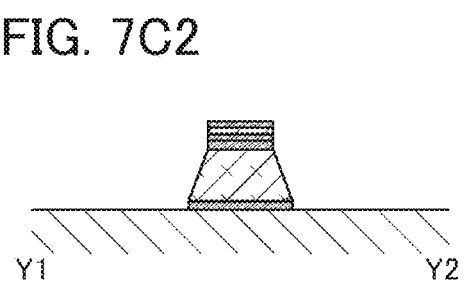
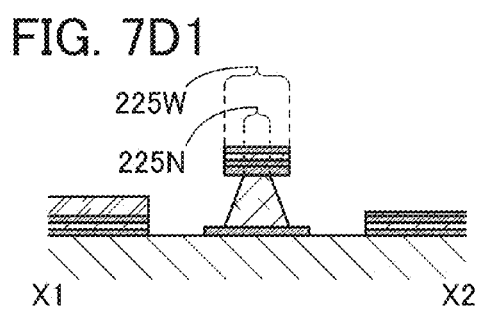
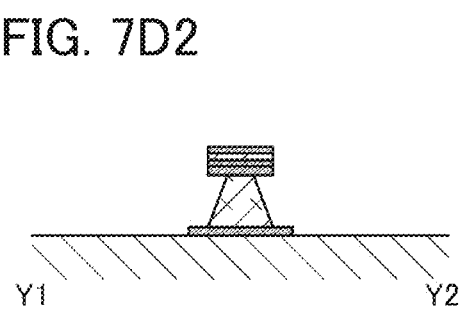
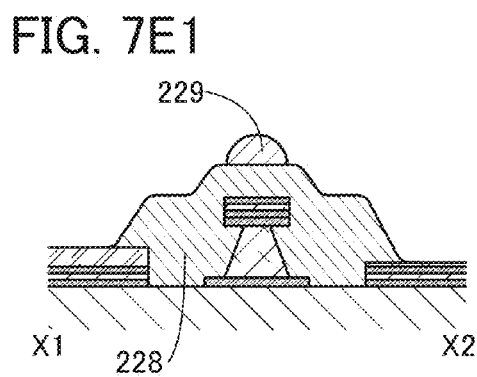
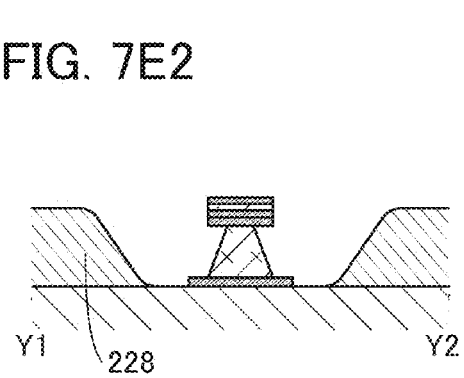

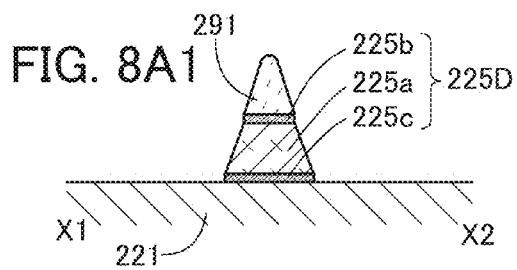
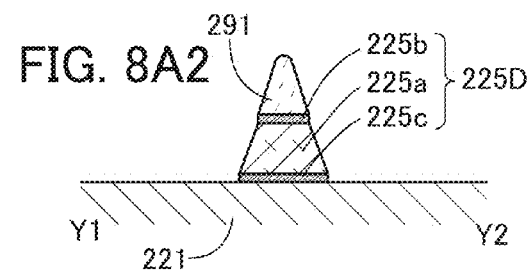
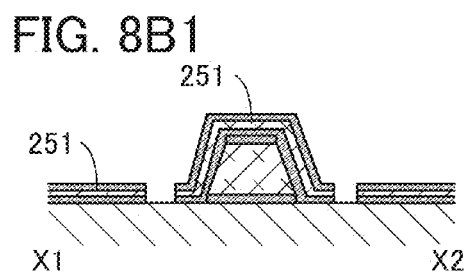
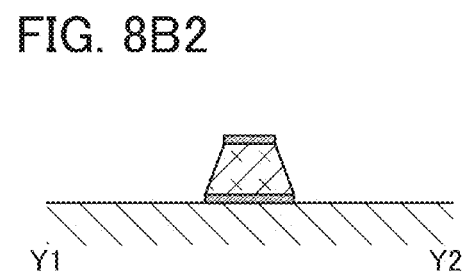
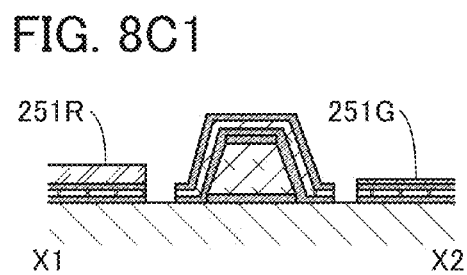
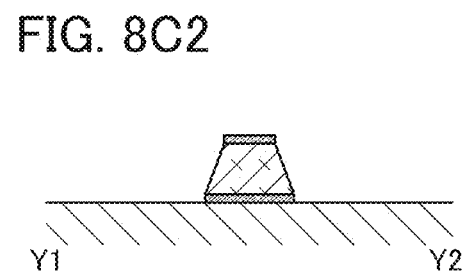
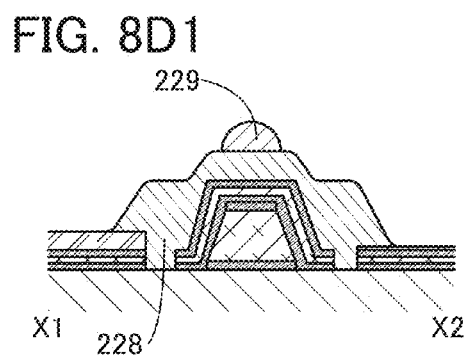
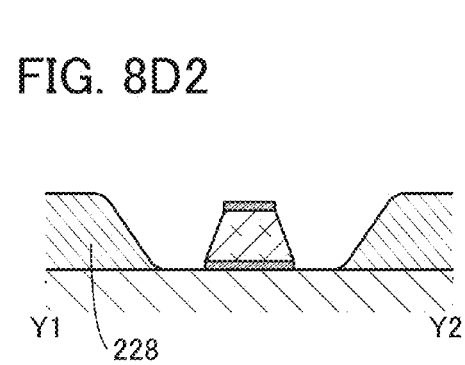
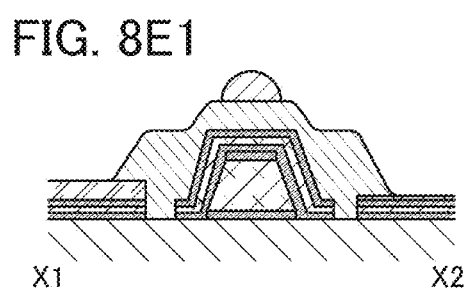
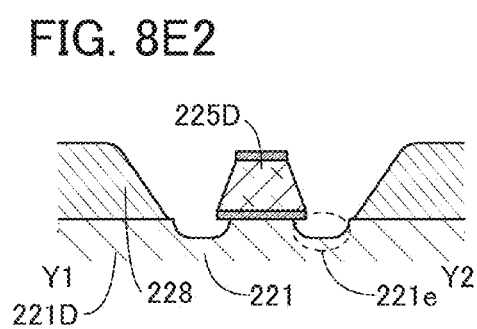

FIG. 12A
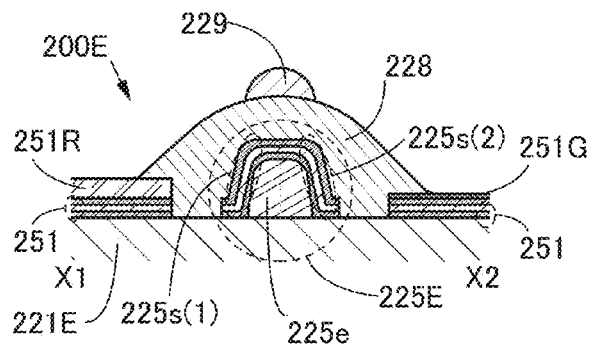
FIG. 12B1
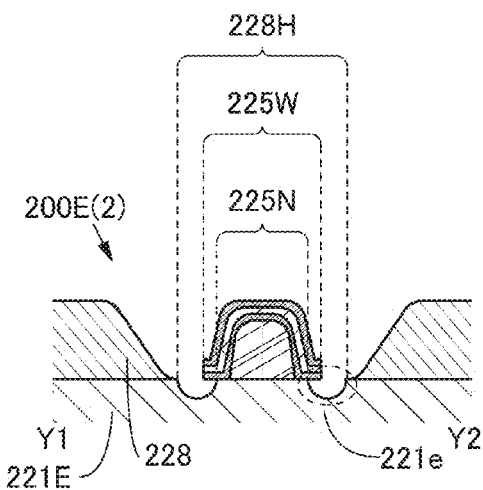
FIG. 12B2
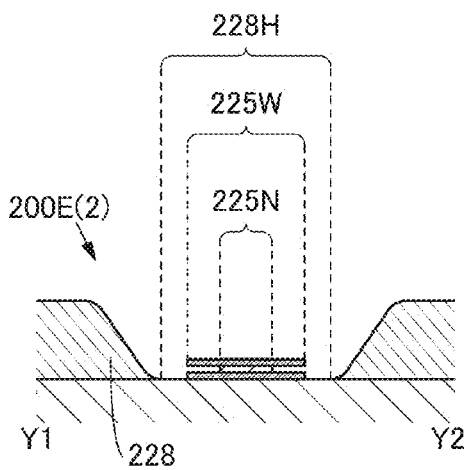
FIG. 12C
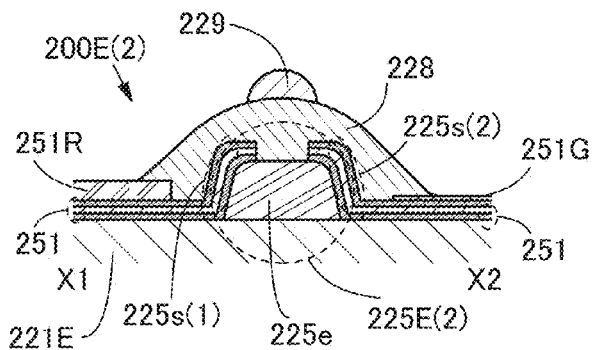

FIG. 13A1
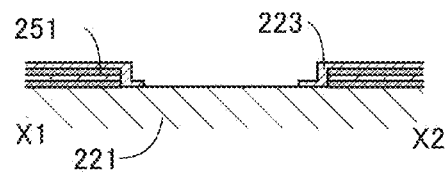
FIG. 13A2
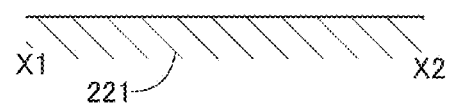
FIG. 13B1
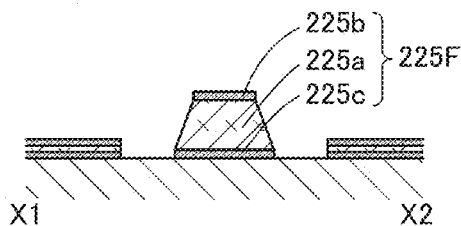
FIG. 13B2
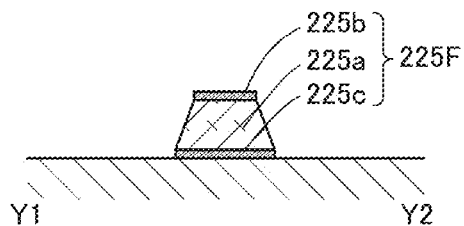
FIG. 13C1
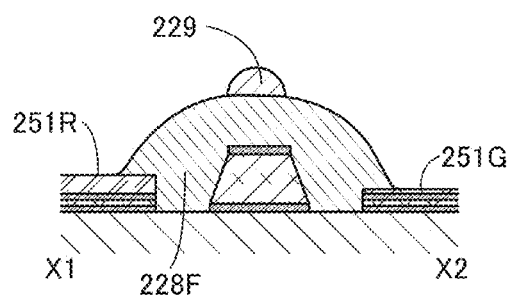
FIG. 13C2
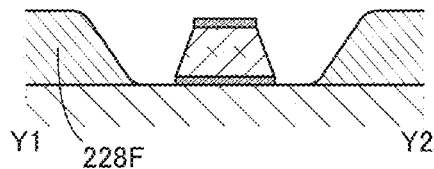
FIG. 13D1
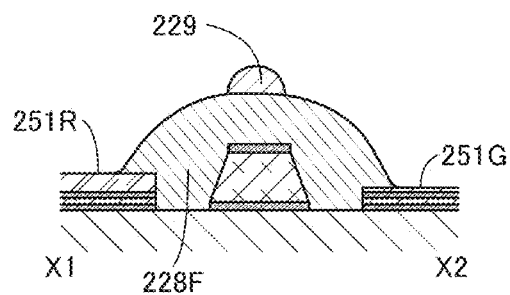
FIG. 13D2
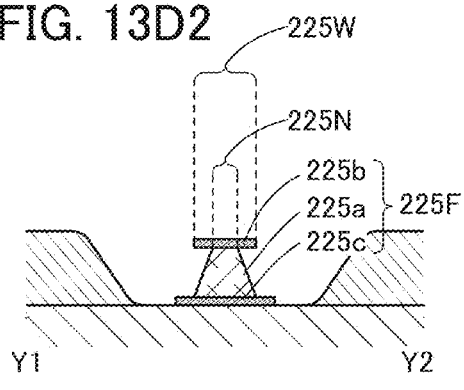

LIGHT-EMITTING MODULE, LIGHT-EMITTING PANEL, AND LIGHT-EMITTING DEVICE

BACKGROUND OF THE INVENTION

1. Field of the Invention

The present invention relates to an object, a method, or a fabrication method. In addition, the present invention relates to a process, a machine, manufacture, or a composition of matter. Specifically, the present invention relates to a semiconductor device, a display device, a light-emitting device, or a fabrication method thereof, for example. More specifically, the present invention relates to a light-emitting module, a light-emitting panel, and a light-emitting device.

2. Description of the Related Art

A structure including, between a first substrate and a second substrate, a first electrode provided over the first substrate, a second electrode provided over the first electrode with a layer containing a light-emitting organic compound provided therebetween, and a sacrifice layer formed using a liquid material and provided over the second electrode is known (Patent Document 1).

REFERENCE

Patent Document

[Patent Document 1] Japanese Published Patent Application No. 2013-38069

SUMMARY OF THE INVENTION

A light-emitting module, a light-emitting panel, or a light-emitting device with favorable energy efficiency is demanded. A light-emitting module, a light-emitting panel, or a light-emitting device with high reliability is demanded. A method for fabricating a light-emitting panel with high energy efficiency or high reliability is demanded. A light-emitting panel or a light-emitting device in which luminance unevenness is controlled in a large area is demanded.

One embodiment of the present invention has been made in view of the foregoing technical background. Thus, an object is to provide a novel light-emitting module, a novel light-emitting panel, or a novel light-emitting device. Another object is to provide a light-emitting module, a light-emitting panel, or a light-emitting device with high energy efficiency. A further object is to provide a light-emitting module, a light-emitting panel, or a light-emitting device that has reduced power consumption by extracting light of a given intensity with less power. A still further object is to provide a light-emitting module, a light-emitting panel, or a light-emitting device that has improved reliability by inhibiting heat generation caused by wasted power. A yet still further object is to provide a light-emitting panel in which luminance unevenness is controlled in a large area.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting module that includes an insulating surface; a lower electrode over the insulating surface; a protrusion over the insulating surface having a sidewall sloping toward the lower electrode; a light-transmitting partition overlapping with an end portion of the lower electrode and the sidewall of the protrusion; a light-emitting element including the lower electrode, an upper electrode overlapping with the lower electrode, and a layer containing a light-emitting organic compound between the lower electrode and the upper electrode; and a counter substrate sealing the light-emitting element provided between the insulating surface and the counter substrate. The sidewall of the protrusion can reflect light emitted from the light-emitting element.

In the above light-emitting module of one embodiment of the present invention, the sidewall of the protrusion may have a surface sloping toward the lower electrode at an angle greater than or equal to 30° and less than or equal to 75°.

In the above light-emitting module of one embodiment of the present invention, the lower electrode may include a reflective film reflecting light emitted from the layer containing the light-emitting organic compound, and the sidewall of the protrusion may contain the same material as the reflective film.

In the above light-emitting module of one embodiment of the present invention, the protrusion that can reflect light emitted from the light-emitting element is provided inside the light-transmitting partition. Accordingly, light entering the partition is reflected to exit the partition, which prevents a phenomenon in which the light is considerably attenuated or lost in the partition. As a result, the light-emitting module can have high energy efficiency. Alternatively, the light-emitting module can have reduced power consumption because it can extract light of a given intensity with less power. Alternatively, the light-emitting module can have improved reliability because it can inhibit heat generation caused by wasted power.

In the above light-emitting module of one embodiment of the present invention, the partition may contain a material with a refractive index lower than a refractive index of the layer containing the light-emitting organic compound.

In the above light-emitting module of one embodiment of the present invention, an optical bonding layer may be further provided between the light-emitting element and the counter substrate. The optical bonding layer may contain a material with a refractive index higher than a refractive index of the material contained in the partition.

The above light-emitting module of one embodiment of the present invention includes the partition that contains the material with the refractive index lower than the refractive index of the layer containing the light-emitting organic compound. Accordingly, entry of light from the layer containing the light-emitting organic compound into the partition can be prevented.

The above light-emitting module of one embodiment of the present invention includes the optical bonding layer that contains the material with the refractive index higher than the refractive index of the material contained in the partition. Accordingly, the proportion of light entering the optical bonding layer is increased and the proportion of light entering the partition can be reduced. In addition, the proportion of light that is reflected off the protrusion and enters the optical bonding layer can be increased.

Accordingly, the light-emitting module can have high energy efficiency. Alternatively, the light-emitting module can have reduced power consumption because it can extract light of a given intensity with less power. Alternatively, the light-emitting module can have improved reliability because it can inhibit heat generation caused by wasted power.

One embodiment of the present invention is a light-emitting panel that includes an insulating surface; a first lower electrode and a second lower electrode over the insulating surface; a protrusion over the insulating surface having a first sidewall sloping toward the first lower electrode and a second sidewall sloping toward the second lower electrode; a light-transmitting partition overlapping with an end portion of the first lower electrode, the first sidewall of the protrusion, an end portion of the second lower electrode, and the second sidewall of the protrusion; a first light-emitting element including the first lower electrode, an upper electrode overlapping with the first lower electrode, and a layer containing a light-emitting organic compound between the first lower electrode and the upper electrode; a second light-emitting element including the second lower electrode, the upper electrode overlapping with the second lower electrode, and the layer containing the light-emitting organic compound between the second lower electrode and the upper electrode; and a counter substrate sealing the first light-emitting element and the second light-emitting element provided between the insulating surface and the counter substrate. The first sidewall and the second sidewall of the protrusion can reflect light emitted from the first light-emitting element and light emitted from the second light-emitting element, respectively.

In the above light-emitting panel of one embodiment of the present invention, the protrusion that can reflect light emitted from the first and second light-emitting elements is provided inside the light-transmitting partition. Accordingly, light entering the partition is reflected to exit the partition, which prevents a phenomenon in which the light is considerably attenuated or lost in the partition. As a result, the light-emitting panel can have high energy efficiency. Alternatively, the light-emitting panel can have reduced power consumption because it can extract light of a given intensity with less power. Alternatively, the light-emitting panel can have improved reliability because it can inhibit heat generation caused by wasted power.

One embodiment of the present invention is a light-emitting panel that includes an insulating surface; a first lower electrode and a second lower electrode over the insulating surface; a conductive protrusion over the insulating surface having a first sidewall sloping toward the first lower electrode and a second sidewall sloping toward the second lower electrode; a light-transmitting partition overlapping with an end portion of the first lower electrode, the first sidewall of the conductive protrusion, an end portion of the second lower electrode, and the second sidewall of the conductive protrusion; a first light-emitting element including the first lower electrode, an upper electrode overlapping with the first lower electrode, and a layer containing a light-emitting organic compound between the first lower electrode and the upper electrode; a second light-emitting element including the second lower electrode, the upper electrode overlapping with the second lower electrode, and the layer containing the light-emitting organic compound between the second lower electrode and the upper electrode; and a counter substrate sealing the first light-emitting element and the second light-emitting element provided between the insulating surface and the counter substrate. The partition has an opening portion overlapping with the conductive protrusion. The conductive protrusion is electrically connected to the upper electrode in the opening portion. The first sidewall and the second sidewall of the conductive protrusion can reflect light emitted from the first light-emitting element and light emitted from the second light-emitting element, respectively.

In any of the above light-emitting panels of embodiments of the present invention, the sidewall of the protrusion may have a surface sloping toward the lower electrode at an angle greater than or equal to 30° and less than or equal to 75°.

In any of the above light-emitting panels of embodiments of the present invention, the first lower electrode may include a reflective film reflecting light emitted from the layer containing the light-emitting organic compound; the second lower electrode may include a reflective film reflecting the light emitted from the layer containing the light-emitting organic compound; and the first and second sidewalls of the protrusion may contain the same material as the first and second lower electrodes.

In the above light-emitting panel of one embodiment of the present invention, the protrusion that can reflect light emitted from the first and second light-emitting elements is provided inside the light-transmitting partition. Furthermore, the protrusion has conductivity, and part of the protrusion is electrically connected to the upper electrode in the opening portion provided in the partition.

Accordingly, light entering the partition is reflected to exit the partition, which prevents a phenomenon in which the light is considerably attenuated or lost in the partition. Furthermore, the conductive protrusion electrically connected to the upper electrode serves as a current path, thereby distributing the current to the upper electrode uniformly. Moreover, voltage drop due to electrical resistance of the upper electrode can be reduced, and current can flow to the upper electrode uniformly.

As a result, the light-emitting panel can have high energy efficiency. Alternatively, the light-emitting panel can have reduced power consumption because it can extract light of a given intensity with less power. Alternatively, the light-emitting panel can have improved reliability because it can inhibit heat generation caused by wasted power. Alternatively, in the light-emitting panel, luminance unevenness can be reduced.

In any of the above light-emitting panels of embodiments of the present invention, the partition may contain a material with a refractive index lower than a refractive index of the layer containing the light-emitting organic compound.

In any of the above light-emitting panels of embodiments of the present invention, an optical bonding layer may be further provided between the first light-emitting element and the counter substrate and between the second light-emitting element and the counter substrate. The optical bonding layer may contain a material with a refractive index higher than a refractive index of a material contained in the partition.

The above light-emitting panel of one embodiment of the present invention includes the partition that contains the material with the refractive index lower than the refractive index of the layer containing the light-emitting organic compound. Accordingly, entry of light from the layer containing the light-emitting organic compound into the partition can be prevented.

The above light-emitting panel of one embodiment of the present invention includes the optical bonding layer that contains the material with the refractive index higher than the refractive index of the material contained in the partition. Accordingly, the proportion of light entering the optical bonding layer is increased and the proportion of light entering the partition can be reduced. In addition, the proportion of light that is reflected off the protrusion and enters the optical bonding layer can be increased.

As a result, the light-emitting panel can have high energy efficiency. Alternatively, the light-emitting panel can have reduced power consumption because it can extract light of a given intensity with less power. Alternatively, the light-emitting panel can have improved reliability because it can inhibit heat generation caused by wasted power.

In the above light-emitting panel of one embodiment of the present invention, the protrusion may have, in a cross section meeting the insulating surface at a right angle, a wide portion and a narrow portion that is closer to the insulating surface than the wide portion is.

In the above light-emitting panel of one embodiment of the present invention, the insulating surface may have a recessed portion partly overlapping with the protrusion, and a wide portion including the protrusion and a narrow portion adjacent to the recessed portion may be provided in a cross section meeting the insulating surface at a right angle.

In the above light-emitting panel of one embodiment of the present invention, the protrusion has the wide portion that is apart from the insulating surface and the narrow portion that is between the insulating surface and the wide portion. Accordingly, the upper electrode and the protrusion can be electrically connected to each other between the wide portion and the narrow portion of the protrusion.

As a result, the light-emitting panel can have high energy efficiency. Alternatively, in the light-emitting panel, luminance unevenness can be reduced. Alternatively, the light-emitting panel can be fabricated easily.

One embodiment of the present invention is a light-emitting device including any of the above light-emitting panels.

In the above light-emitting device of one embodiment of the present invention, the protrusion that can reflect light emitted from the light-emitting element is provided inside the light-transmitting partition, and a light-emitting panel with improved energy efficiency is included. Accordingly, light entering the partition is reflected to exit the partition, which prevents a phenomenon in which the light is considerably attenuated or lost in the partition.

As a result, the light-emitting device can have high energy efficiency. Alternatively, the light-emitting device can have reduced power consumption because it can extract light of a given intensity with less power. Alternatively, the light-emitting device can have improved reliability because it can inhibit heat generation caused by wasted power.

Note that in this specification, an "EL layer" refers to a layer provided between a pair of electrodes in a light-emitting element. Thus, a layer containing a light-emitting organic compound and interposed between electrodes is an embodiment of the EL layer.

In this specification, in the case where a substance A is dispersed in a matrix formed using a substance B, the substance B forming the matrix is referred to as a host material, and the substance A dispersed in the matrix is referred to as a guest material. Note that the substance A and the substance B may each be a single substance or a mixture of two or more kinds of substances.

Note that a light-emitting device in this specification means an image display device or a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted on a substrate over which a light-emitting element is formed by a chip on glass (COG) method.

In one embodiment of the present invention, a novel light-emitting module, a novel light-emitting panel, or a novel light-emitting device can be provided. A light-emitting module, a light-emitting panel, or a light-emitting device with high energy efficiency can be provided. A light-emitting module, a light-emitting panel, or a light-emitting device that has reduced power consumption by extracting light of a given intensity with less power can be provided. A light-emitting module, a light-emitting panel, or a light-emitting device that has improved reliability by inhibiting heat generation caused by wasted power can be provided.

BRIEF DESCRIPTION OF THE DRAWINGS

FIGS. 2A to 2C are views illustrating a structure of a light-emitting panel.

FIGS. 6A1 to 6E1 and FIGS. 6A2 to 6E2 are views illustrating a method for fabricating a light-emitting panel.

FIGS. 7A1 to 7E1 and FIGS. 7A2 to 7E2 are views illustrating a method for fabricating a light-emitting panel.

FIGS. 8A1 to 8E1 and FIGS. 8A2 to 8E2 are views illustrating a method for fabricating a light-emitting panel.

FIGS. 12A, 12B1, 12B2, and 12C are views illustrating protrusions and partitions that are applicable to a light-emitting panel.

FIGS. 13A1 to 13D1 and FIGS. 13A2 to 13D2 are views illustrating a method for fabricating a protrusion and a partition that are applicable to a light-emitting panel.

DETAILED DESCRIPTION OF THE INVENTION

Figure 1A:
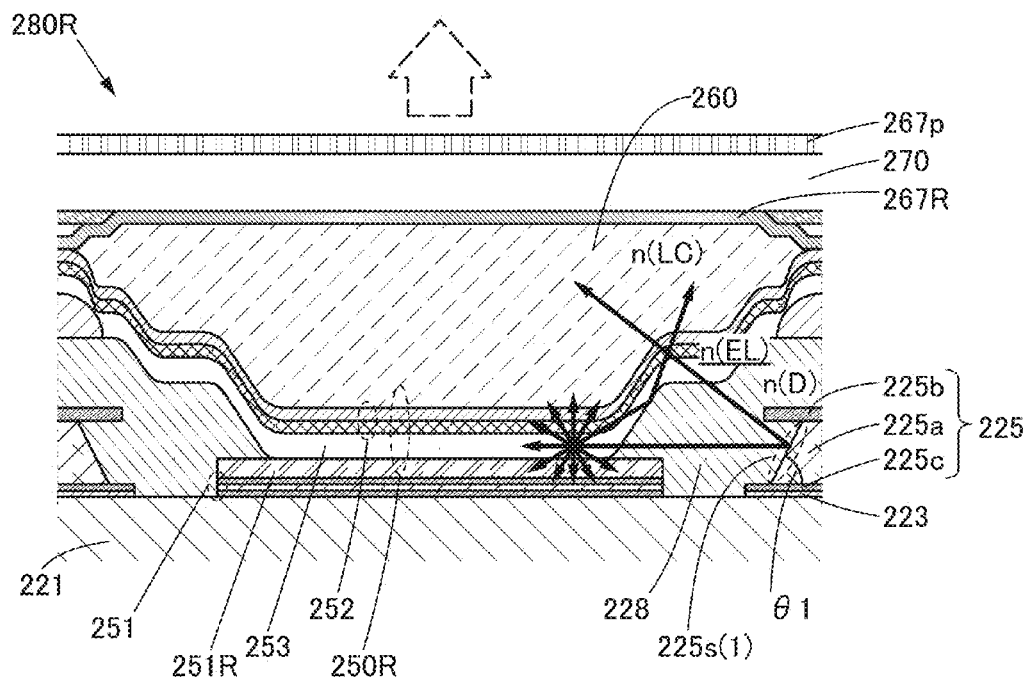
FIGS. 1A and 1B are views illustrating structures of light-emitting modules.

Example of Problem Solvable by One Embodiment of the Present Invention

There is known a light-emitting element (also referred to as organic EL element) that includes a lower electrode, an upper electrode, and a layer containing a light-emitting organic compound between the lower electrode and the upper electrode.

Since a layer containing a light-emitting organic compound (also referred to as an EL layer) has an extremely small thickness (e.g., tens to hundreds of nanometers), the lower electrode and the upper electrode between which the EL layer is provided are easily short-circuited. To prevent a short circuit, in many light-emitting modules using organic EL elements, an insulating structure (hereinafter referred to as partition) is provided to cover an end portion of the lower electrode.

Light emitted from the EL layer is emitted through the lower or upper electrode having a light-transmitting property. Part of the light emitted from the EL layer is transmitted through the EL layer toward the partition that is provided at an end portion of the EL element.

The light entering the partition is not easily emitted out of the partition and is easily attenuated or lost, which has caused a reduction in energy efficiency of the light-emitting module.

One Embodiment of the Present Invention

To solve the above problem, attention has been focused on light emitted from the light-emitting element and entering the partition. Embodiments described below include one embodiment of the present invention capable of efficiently utilizing the light that is emitted from the light light-emitting element and enters the partition.

The light-emitting module of one embodiment of the present invention includes an insulating surface; a lower electrode over the insulating surface; a protrusion over the insulating surface having a sidewall sloping toward the lower electrode; a light-transmitting partition overlapping with an end portion of the lower electrode and the sidewall of the protrusion; and a light-emitting element including the lower electrode, an upper electrode overlapping with the lower electrode, and a layer containing a light-emitting organic compound between the lower electrode and the upper electrode. The sidewall of the protrusion can reflect light emitted from the light-emitting element.

In the above light-emitting module of one embodiment of the present invention, even when light emitted from the light-emitting element enters the partition, the protrusion provided inside the partition reflects the light. Accordingly, the light entering the partition is reflected to exit the partition, which prevents a phenomenon in which the light is considerably attenuated or lost in the partition. Moreover, the light emitted from the light-emitting element can be efficiently utilized.

As a result, the light-emitting module can have high energy efficiency. Alternatively, the light-emitting module can have reduced power consumption because it can extract light of a given intensity with less power. Alternatively, the light-emitting module can have improved reliability because it can inhibit heat generation caused by wasted power. Alternatively, a light-emitting panel with high energy efficiency that includes a plurality of the light-emitting modules provided over one substrate can be provided.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Embodiment 1

In this embodiment, structures of a light-emitting module of one embodiment of the present invention will be described with reference to FIGS. 1A and 1B.

FIG. 1A is a cross-sectional view illustrating a structure of a light-emitting module of one embodiment of the present invention. FIG. 1B is a cross-sectional view illustrating a structure of a light-emitting module of one embodiment of the present invention.

A structure of a light-emitting module 280R will be described with reference to FIG. 1A.
<Light-Emitting Module>

The light-emitting module 280R described in this embodiment includes an insulating surface 221, a first lower electrode 251R over the insulating surface 221, and a protrusion 225 over the insulating surface 221 having a first sidewall 225$s$(1) sloping toward the first lower electrode 251R.

The light-emitting module 280R also includes a light-transmitting partition 228 that overlaps with an end portion of the first lower electrode 251R and the first sidewall 225$s$(1).

The light-emitting module 280R also includes a first light-emitting element 250R that includes the first lower electrode 251R, an upper electrode 252 overlapping with the first lower electrode 251R, and a layer 253 containing a light-emitting organic compound between the first lower electrode 251R and the upper electrode 252.

The light-emitting module 280R also includes a counter substrate 270 that seals the first light-emitting element 250R provided between the insulating surface 221 and the counter substrate 270.

The first sidewall 225$s$(1) can reflect light emitted from the first light-emitting element 250R.

In the light-emitting module 280R described in this embodiment, the protrusion 225 that can reflect light emitted from the first light-emitting element 250R is provided inside the light-transmitting partition 228. Accordingly, light entering the partition 228 is reflected to exit the partition 228, which prevents a phenomenon in which the light is considerably attenuated or lost in the partition. As a result, the light-emitting module can have high energy efficiency. Alternatively, the light-emitting module can have reduced power consumption because it can extract light of a given intensity with less power. Alternatively, the light-emitting module can have improved reliability because it can inhibit heat generation caused by wasted power.

The first sidewall 225$s$(1) has a surface sloping toward the first lower electrode 251R at an angle θ1 greater than or equal to 30° and less than or equal to 75°, preferably greater than or equal to 30° and less than or equal to 60°. Light emitted from the light-emitting element does not easily enter a surface that slopes at an angle less than 30°. Light that enters a surface sloping at an angle greater than 75° is not easily extracted in an upper direction.

The partition 228 contains a material with a refractive index n(D), which is lower than a refractive index n(EL) of the layer 253 containing the light-emitting organic compound. Light emitted from the layer 253 containing the light-emitting organic compound does not easily enter the partition 228 with the refractive index n(D), which is lower than the refractive index n(EL) of the layer 253 containing the light-emitting organic compound. Furthermore, conditions of total reflection are easily satisfied.

The light-emitting module 280R also includes an optical bonding layer 260 between the first light-emitting element 250R and the counter substrate 270. The optical bonding layer 260 contains a material with a refractive index n(LC), which is higher than the refractive index n(D) of the material contained in the partition 228. Accordingly, the proportion of light entering the optical bonding layer 260 is increased and the proportion of light entering the partition 228 can be reduced. In addition, the proportion of light that is reflected off the protrusion 225 and enters the optical bonding layer 260 can be increased.

As a result, the light-emitting module can have high energy efficiency. Alternatively, the light-emitting module can have reduced power consumption because it can extract light of a given intensity with less power. Alternatively, the light-emitting module can have improved reliability because it can inhibit heat generation caused by wasted power.

The light-emitting module 280R described in this embodiment also includes a coloring layer 267R on a side to which the first light-emitting element 250R emits light. The coloring layer 267R, which contains a predetermined material, absorbs light of a predetermined wavelength. Thus, undesired light contained in the light emitted from the first light-emitting element 250R can be removed.

The light-emitting module 280R also includes an anti-reflection layer 267p on a side to which the light-emitting module 280R emits light. The anti-reflection layer 267p reduces the intensity of external light that is reflected by the light-emitting module 280R toward an observer.

With the anti-reflection layer 267p, the ratio of the intensity of the reflected external light to the intensity of the light emitted from the light-emitting module 280R can be reduced. As a result, favorable light emission with high contrast can be performed. Specifically, a display device that uses the light-emitting module 280R can provide vivid display.

Components of the light-emitting module 280R in this embodiment will be described below.

<<Insulating Surface>>

The insulating surface 221 is not particularly limited as long as it has an insulating property. For example, as the insulating surface 221, a surface of an insulating substrate, a surface of an insulating film provided over a substrate, a surface of an island-shaped insulating layer provided over a substrate, and the like can be used.

A surface of an insulating film formed over any of a variety of functional layers can also be used. For example, it is possible to use a surface of an insulating film formed over a functional layer including an electrical circuit over a substrate.

Specifically, it is possible to use a surface of an insulating film that is provided over a functional layer including a switching element for selecting whether or not to supply power to the lower electrode of the light-emitting element, or to use a surface of an insulating film for planarizing a step or an unevenness of a functional layer.

Note that examples of the switching element include a transistor. Specifically, a transistor whose channel is formed in a semiconductor layer containing a single crystal, a poly-crystal, an amorphous part, or the like can be given as an example. For the semiconductor layer, it is possible to use an organic semiconductor, a compound semiconductor, silicon, germanium, an oxide semiconductor, or the like.

As a substrate having an insulating surface, glass, ceramics, an inorganic film, a resin plate, a resin film, a stack including a plurality of materials selected from these, a conductive substrate whose surface is provided with a material selected from the above, or the like can be used.

Specifically, glass such as non-alkali glass, soda-lime glass, potash glass, or crystal glass can be used.

As an inorganic film having an insulating surface, for example, a metal oxide film, a metal nitride film, a metal oxynitride film, or a stacked-layer film including a plurality of films selected from these can be used. Specifically, silicon oxide, silicon nitride, silicon oxynitride, an alumina film, or the like can be used.

As a resin having an insulating surface, it is possible to use a plate-like material containing a polyester, a polyolefin, a polyamide, a polyimide, a polycarbonate, an acrylic resin, a composite of a plurality of resins selected from these, a film-like material formed in such a manner that a material selected from these is processed to be thin, or a stack including a plurality of materials selected from these.

<<Lower Electrode>>

The first lower electrode 251R is not particularly limited as long as it can be used in the first light-emitting element 250R. Details of materials that can be used for the first light-emitting element 250R are described in Embodiment 5.

Figure 1B:
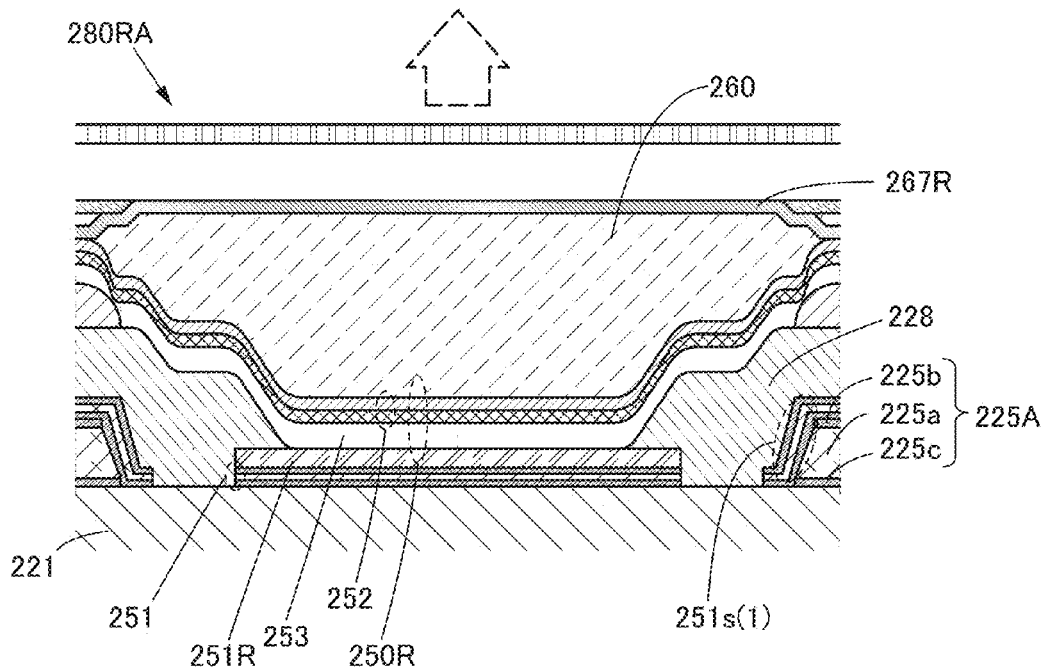

The first lower electrode 251R illustrated in FIGS. 1A and 1B is a conductive film which has a light-transmitting property and is stacked over a reflective film 251.

<<Upper Electrode>>

The upper electrode 252 is not particularly limited as long as it has a light-transmitting property and can be used in the first light-emitting element 250R. Details of materials that can be used for the first light-emitting element 250R are described in Embodiment 5.

The upper electrode 252 illustrated in FIGS. 1A and 1B is a semi-transmissive and semi-reflective conductive film that is a stack in which a metal oxide film with a light-transmitting property and conductivity is stacked over a metal thin film having a thickness small enough to allow light transmission (preferably greater than or equal to 5 nm and less than or equal to 30 nm, for example).

<<First Light-Emitting Element>>

The first light-emitting element 250R is not particularly limited as long as it emits light in response to power supply to the first lower electrode 251R and the upper electrode 252. Details of materials that can be used for the first light-emitting element 250R are described in Embodiment 5.

In the layer 253 containing the light-emitting organic compound in the first light-emitting element 250R which is illustrated in FIGS. 1A and 1B, a plurality of light-emitting units and an intermediate layer between the light-emitting units are provided (this structure is also referred to as a tandem structure). The layer 253 containing the light-emitting organic compound emits white light containing red light, green light, and blue light.

The first lower electrode 251R and the upper electrode 252 form a microresonator (microcavity). By placing the light-emitting element in a microresonator, interference of light emitted from the light-emitting element occurs, so that light of a specific color can be efficiently extracted.

<<Protrusion>>

The protrusion 225 has the first sidewall 225s(1) that reflects light emitted from the first light-emitting element 250R.

The first sidewall 225s(1) preferably has a high reflectivity of visible light emitted from the first light-emitting element 250R.

For a film that reflects visible light, a metal is used, for example. Specifically, it is possible to use metal materials such as silver, aluminum, platinum, gold, and copper, an alloy material containing any of these, and a stacked-layer film containing a plurality of materials selected from these.

Examples of the alloy containing silver include a silver-neodymium alloy and a magnesium-silver alloy. As examples of the alloy containing aluminum, an aluminum-nickel-lanthanum alloy, an aluminum-titanium alloy, and an aluminum-neodymium alloy can be given.

As the stacked-layer film, for example, a film in which a titanium film, an aluminum film, and a titanium film are stacked in that order can be used.

The first sidewall 225s(1) preferably has a surface sloping toward the first lower electrode 251R at an angle greater than or equal to 30° and less than or equal to 75°, preferably greater than or equal to 30° and less than or equal to 60°.

The protrusion 225 having the first sidewall 225s(1) with a sloping surface can be formed by the following method, for example: a resist mask whose end portion is gently sloped is formed, and a film to be the protrusion 225 is etched while the resist mask is made to recede. Note that details of a method for forming the first sidewall 225s(1) are described in Embodiment 4.

<<Partition>>

The partition 228 has a light-transmitting property and includes an opening portion that overlaps with the first lower electrode 251R. An end portion of the partition 228 that overlaps with the first lower electrode 251R has a forward tapered shape over the first lower electrode 251R. Furthermore, to prevent a short circuit between the first lower electrode 251R and the upper electrode 252, a step formed at the end portion has a reduced size. Specifically, the end portion of the partition 228 has a cross section in the form of an S having a gradual and continuous curvature from the first lower electrode 251R. Note that the angle of the end portion of the partition is greater than or equal to 5° and less than or equal to 45°, preferably greater than or equal to 5° and less than or equal to 30°.

Examples of a material that can be used for the partition 228 include an organic material, an inorganic material, and a composite material of these.

For the partition 228, a polyester, a polyolefin, a polyamide, a polyimide, a polycarbonate, an acrylic resin, or the like, or a composite material of a plurality of kinds of resins selected from these can be used, for example. A photosensitive resin can also be used.

The partition 228 contains a material having a refractive index higher than or equal to 1.45 and lower than or equal to 1.65, preferably higher than or equal to 1.45 and lower than or equal to 1.60.

<<Counter Substrate>>

The counter substrate 270 transmits light emitted from the first light-emitting element 250R.

The counter substrate 270 preferably prevents dispersion of unintended impurities to the first light-emitting element 250R (i.e., the counter substrate 270 preferably has a gas barrier property). For example, the counter substrate 270 preferably has a water vapor transmission rate of $10^{-5}$ g/m²·day or less, preferably $10^{-6}$ g/m²·day or less.

The counter substrate 270 preferably prevents application of undesired external force to the first light-emitting element 250R.

Note that the counter substrate 270 has heat resistance high enough to withstand the fabrication process and is not particularly limited in thickness and size as long as they can be applied to a fabrication apparatus. In addition, the counter substrate 270 may have a single-layer structure or a layered structure including two or more layers.

The light-transmitting counter substrate 270 preferably has a refractive index higher than or equal to 1.5 and lower than or equal to 1.65.

<<Optical Bonding Layer>>

A material for the optical bonding layer 260 preferably has a refractive index higher than 1.5 and lower than or equal to 3.0 with respect to light emitted from the first light-emitting element 250R.

For example, an organic material, a liquid-crystal material, or a polymer material can be used. Specifically, a polyester, a polyolefin, a polyamide, a polyimide, a polycarbonate, an acrylic resin, or a composite material of a plurality of kinds of resins selected from these can be used.

For example, a birefringent resin or a birefringent liquid crystal having a refractive index of 1.65 or lower with respect to one of an ordinary ray and an extraordinary ray and a refractive index of 1.75 or higher with respect to the other of the ordinary ray and the extraordinary ray can be used for the optical bonding layer 260.

Specifically, a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, or a mixed material of any of these liquid crystals and a chiral material or the like can be used.

With the above material, the refractive index of the optical bonding layer 260 gradually decreases from the first light-emitting element 250R side to the counter substrate 270 side.

The partition 228 serves as a rib to control orientation of a liquid crystal contained in the optical bonding layer 260. Thus, the refractive index of the optical bonding layer 260 varies continuously.

The first light-emitting element 250R or the counter substrate 270 may be provided with an alignment film that is in contact with the optical bonding layer 260.

A film that can be used as the alignment film is not particularly limited as long as it controls the orientation of a birefringent material. For example, a film having a polarity on its surface, a film including a substituent having a polarity on its surface, a film including a stereostructure on its surface, a film including a regular stereostructure on its surface, or the like can be used.

For example, a film that can control the orientation of a birefringent material by rubbing can be used. Specifically, an alignment film such as a polyimide film containing a hydrophobic substituent can be used. Note that as the hydrophobic substituent, an alkyl group, a substituent containing fluorine, and the like can be given.

A film that can control the orientation of a birefringence material by light irradiation from a given direction can be used. Specifically, an alignment film such as a polyimide film containing an azobenzene derivative, poly(vinyl cinnamate), or the like can be used.

A film in which a material vapor-deposited from a given direction can control the orientation of a birefringence material can be used. Specifically, a vapor-deposited film of silicon oxide or the like can be used.

In particular, a resin material of a polyimide, a polyimide-amide, a polyamic acid, or an acrylic resin, or the like is preferably used.

<<Coloring Layer>>

The coloring layer 267R absorbs light of a predetermined wavelength.

Examples of the color of light that is selectively transmitted through the coloring layer 267R include red, green, blue, cyan, magenta, and yellow.

Examples of a material that can be used for the coloring layer 267R include a resin in which a pigment is dispersed and a resin containing a dye.

Examples of the pigment that can be used for the coloring layer 267R include a quinacridone (red or magenta) pigment, an anthraquinone (red or yellow) pigment, a polyazo (yellow) pigment, a benzimidazolone (yellow or orange) pigment, a copper phthalocyanine (green or blue) pigment, a soluble azo pigment, and an insoluble azo pigment.

Modification Example

A modification example of the light-emitting module in this embodiment will be described with reference to FIG. 1B.

FIG. 1B is a cross-sectional view illustrating a light-emitting module 280RA of one embodiment of the present invention.

The light-emitting module 280RA, which is described in this modification example, has the same structure as the light-emitting module 280R (see FIG. 1A) except that the structure of a protrusion 225A is different. Therefore, description is given here of the structure of the protrusion 225A; for the structures of the other components, refer to the description of the light-emitting module 280R.

The first lower electrode 251R of the light-emitting module 280RA is provided with the reflective film 251 that reflects light emitted from the layer 253 containing the light-emitting organic compound. The protrusion 225A of the light-emitting module 280RA includes, in its sidewall 251s(1), a film that contains the same material as the reflective film 251.

The first lower electrode 251R and the sidewall of the protrusion 225A each include a material that has a high reflectivity (e.g., 80% or more, preferably 90% or more, further preferably 98% or more) of light emitted from the layer 253 containing the light-emitting organic compound. Accordingly, light entering the partition is reflected to exit the partition, which prevents a phenomenon in which the light is considerably attenuated or lost in the partition. As a result, the light-emitting module can have high energy efficiency. Alternatively, the light-emitting module can have reduced power consumption because it can extract light of a given intensity with less power. Alternatively, the light-emitting module can have improved reliability because it can inhibit heat generation caused by wasted power.

This embodiment can be combined with any of the other embodiments in this specification as appropriate.

Embodiment 2

In this embodiment, structures of light-emitting panels of embodiments of the present invention will be described with reference to FIGS. 2A to 2C and FIGS. 3A and 3B.

FIG. 2A is a top view illustrating a structure of a light-emitting panel of one embodiment of the present invention.

FIG. 2B is a top view of an enlarged part of FIG. 2A.

FIG. 2C is a cross-sectional view along a cutting plane line X1-X2 in FIG. 2B.

A light-emitting panel 200 described in this embodiment includes a region 201. A region 202 is part of the region 201. A plurality of light-emitting modules are provided in the region 201 (see FIG. 2A).

The light-emitting module 280R and a light-emitting module 280G are included in the region 202 (see FIG. 2B). That is, in the light-emitting panel 200, a plurality of the light-emitting modules described in Embodiment 1 are provided adjacent to each other over one insulating surface. Note that one subpixel includes one light-emitting module, and one pixel (e.g., the region 202) includes a plurality of subpixels (e.g., three subpixels).

The structure of the light-emitting panel will be described with reference to FIG. 2C.

<Light-emitting Panel>

The light-emitting panel 200 described in this embodiment includes the insulating surface 221, the first lower electrode 251R and a second lower electrode 251G over the insulating surface 221, and the protrusion 225 over the insulating surface 221 that has the first sidewall 225s(1) sloping toward the first lower electrode 251R and a second sidewall 225s(2) sloping toward the second lower electrode 251G.

Furthermore, the light-transmitting partition 228 is provided to overlap with the end portion of the first lower electrode 251R, the first sidewall 225s(1), an end portion of the second lower electrode 251G, and the second sidewall 225s(2).

The light-emitting panel 200 also includes the first light-emitting element 250R and a second light-emitting element 250G. The first light-emitting element 250R includes the first lower electrode 251R, the upper electrode 252 overlapping with the first lower electrode 251R, and the layer 253 containing the light-emitting organic compound between the first lower electrode 251R and the upper electrode 252. The second light-emitting element 250G includes the second lower electrode 251G, the upper electrode 252 overlapping with the second lower electrode 251G, and the layer 253 containing the light-emitting organic compound between the second lower electrode 251G and the upper electrode 252.

The light-emitting panel 200 also includes the counter substrate 270 that seals the first light-emitting element 250R and the second light-emitting element 250G provided between the insulating surface 221 and the counter substrate 270.

The first sidewall 225s(1) and the second sidewall 225s(2) of the protrusion 225 can reflect light emitted from the first light-emitting element 250R and light emitted from the second light-emitting element 250G, respectively.

In the above light-emitting panel 200 of one embodiment of the present invention, the protrusion 225 that can reflect light emitted from the first and second light-emitting elements 250R and 250G is provided inside the light-transmitting partition 228. Accordingly, light entering the partition 228 is reflected to exit the partition 228, which prevents a phenomenon in which the light is considerably attenuated or lost in the partition 228. As a result, the light-emitting panel can have high energy efficiency. Alternatively, the light-emitting panel can have reduced power consumption because it can extract light of a given intensity with less power. Alternatively, the light-emitting panel can have improved reliability because it can inhibit heat generation caused by wasted power.

The sidewall of the protrusion 225 has a surface sloping toward the lower electrode at an angle greater than or equal to 30° and less than or equal to 75°, preferably greater than or equal to 30° and less than or equal to 60°. For example, the first sidewall 225s(1) has a surface sloping toward the first lower electrode 251R at an angle greater than or equal to 30° and less than or equal to 75°, preferably greater than or equal to 30° and less than or equal to 60°. Similarly, the second sidewall 225s(2) has a surface sloping toward the second lower electrode 251G at an angle greater than or equal to 30° and less than or equal to 75°, preferably greater than or equal to 30° and less than or equal to 60°. Light emitted from the light-emitting element does not easily enter a surface sloping at an angle less than 30°. Light that enters a surface sloping at an angle greater than 75° is not easily extracted in an upper direction.

The partition 228 contains a material with a refractive index that is lower than a refractive index of the layer 253 containing the light-emitting organic compound. Light emitted from the layer 253 containing the light-emitting organic compound does not easily enter the partition 228 with the refractive index that is lower than the refractive index of the layer 253 containing the light-emitting organic compound. Furthermore, conditions of total reflection are easily satisfied.

The light-emitting panel 200 also includes the optical bonding layer 260 between the first light-emitting element 250R and the counter substrate 270 and between the second light-emitting element 250G and the counter substrate 270. The optical bonding layer 260 contains a material with a refractive index higher than the refractive index of the material contained in the partition 228. Accordingly, the proportion of light entering the optical bonding layer 260 is increased and the proportion of light entering the partition 228 can be reduced. In addition, the proportion of light that is reflected off the protrusion 225 and enters the optical bonding layer 260 can be increased.

As a result, the light-emitting panel can have high energy efficiency. Alternatively, the light-emitting panel can have reduced power consumption because it can extract light of a given intensity with less power. Alternatively, the light-emitting panel can have improved reliability because it can inhibit heat generation caused by wasted power.

The light-emitting panel described in this embodiment includes the light-emitting module 280R and the light-emitting module 280G.

The light-emitting module 280R includes the coloring layer 267R on a side to which the first light-emitting element 250R emits light. The light-emitting module 280G includes a coloring layer 267G on a side to which the second light-emitting element 250G emits light. Note that a pixel can be formed by using a plurality of light-emitting modules that emit light of different colors. For example, a pixel can be formed by using light-emitting modules emitting light of red, green, and blue. A light-emitting module emitting light of cyan, magenta, yellow, or white in addition to red, green, and blue may also be provided. When the light-emitting panel includes light-emitting modules that have various emission colors, the light-emitting panel can emit light of various colors.

Note that a partition needs to be provided between adjacent light-emitting elements to separate them. Thus, when the kind of the light-emitting modules provided in the light-emitting panel or the resolution of the light-emitting panel is increased, the ratio of the area of the partition to the area of the light-emitting element rises, in which case the quantity of light entering the partition tends to increase. In view of this, a structure for efficiently extracting light emitted from the light-emitting element is required.

The improvement in the energy efficiency of the light-emitting panel 200 becomes easier as the resolution increases; the energy efficiency can be improved well in a light-emitting device that includes a light-emitting panel with a resolution greater than or equal to 250 ppi and less than or equal to 600 ppi, preferably greater than or equal to 300 ppi and less than or equal to 600 ppi.

The coloring layers, which contain predetermined materials, each absorb light of a predetermined wavelength. This structure makes it possible to remove undesired light contained in the light emitted from the light-emitting elements.

The light-emitting panel 200 includes an anti-reflection layer 267p on a side to which the light-emitting panel 200 emits light. The anti-reflection layer 267p reduces the intensity of external light that is reflected by the light-emitting panel 200 toward an observer.

With the anti-reflection layer 267p, the ratio of the intensity of the reflected external light to the intensity of the light emitted from the light-emitting panel 200 can be reduced. As a result, favorable light emission with high contrast can be provided. Specifically, a display device that uses the light-emitting panel 200 can provide vivid display.

Components of the light-emitting panel 200 in this embodiment will be described below. Note that described below are components that are not described in Embodiment 1; for the components that are described in Embodiment 1, refer to the description in Embodiment 1.

<<Spacer>>

The light-emitting panel 200 includes a spacer 229 between the partition 228 and the counter substrate 270. The spacer 229 can keep a certain distance between the partition 228 and the counter substrate 270.

The spacer 229 has a shape of an island-shaped film, a columnar shape, or a spherical shape.

Examples of a material that can be used for the spacer 229 include an organic material and an inorganic material.

As examples of the organic material, a polyester, a polyolefin, a polyamide, a polyimide, a polycarbonate, an acrylic resin, and a composite material of a plurality of kinds of resins selected from these can be given.

As the inorganic material, for example, a metal, a metal oxide, a metal nitride, a metal oxynitride, or a plurality of materials selected from these can be used. Specifically, aluminum, titanium, molybdenum, silicon oxide, silicon nitride, silicon oxynitride, an alumina film, or the like can be used.

As other examples of the material that can be used for the spacer 229, a filler and a photosensitive resin can be given.

<<Light-Blocking Layer>>

The light-emitting panel 200 includes a light-blocking layer 267BM between the partition 228 and the counter substrate 270. The light-blocking layer 267BM can absorb undesired light. The undesired light is, for example, external light entering the light-emitting panel 200, or light that enters a light-emitting module from a light-emitting element of an adjacent light-emitting module.

Examples of a material that can be used for the light-blocking layer 267BM include a resin in which a pigment is dispersed, a resin containing a dye, and an inorganic film such as a black chromium film.

As examples of a pigment that can be used for the light-blocking layer 267BM, carbon black, a metal oxide, and a composite oxide containing a solid solution of a plurality of metal oxides can be given.

<<Protrusion>>

The protrusion 225 has the first sidewall 225s(1) reflecting light emitted from the first light-emitting element 250R and the second sidewall 225s(2) reflecting light emitted from the second light-emitting element 250G. In other words, one protrusion 225 can reflect light emitted from each of two light-emitting elements.

The first lower electrode 251R of the light-emitting panel 200 is provided with the reflective film 251 that reflects light emitted from the layer containing the light-emitting organic compound. The second lower electrode 251G is provided with the reflective film that reflects light emitted from the layer containing the light-emitting organic compound. The sidewall of the protrusion 225 can contain the same material as the reflective film 251.

For example, the first lower electrode 251R and the sidewall of the protrusion 225 each include a material that has a high reflectivity (e.g., 80% or more, preferably 90% or more, further preferably 98% or more) of light emitted from the layer 253 containing the light-emitting organic compound. With this structure, light entering the partition is reflected to exit the partition, which prevents a phenomenon in which the light is considerably attenuated or lost in the partition.

Modification Example 1

A modification example of the light-emitting panel in this embodiment will be described with reference to FIGS. 3A and 3B.

Figure 3A:
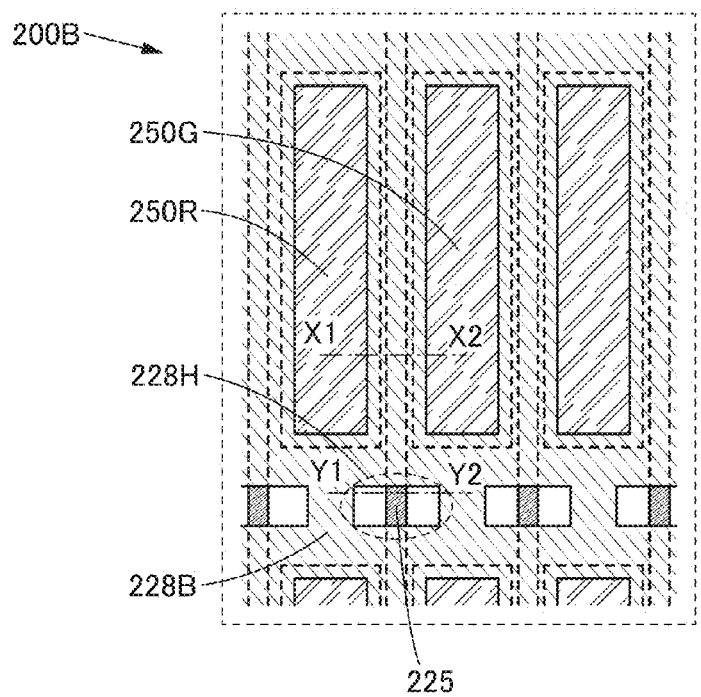
FIGS. 3A and 3B are views illustrating a structure of a light-emitting panel.

FIG. 3A is a top view illustrating a modification example of the light-emitting panel described in this embodiment.

Figure 3B:
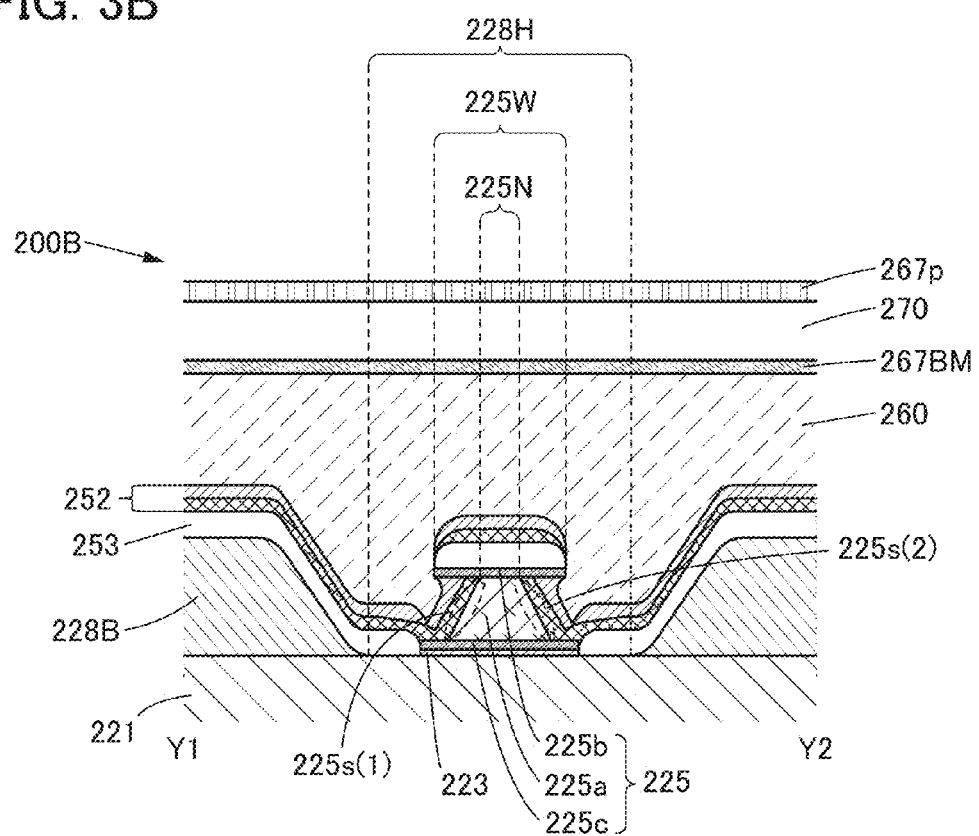

FIG. 3B is a cross-sectional view along a cutting plane line Y1-Y2 in FIG. 3A.

A light-emitting panel 200B, which is described in this modification example, has the same structure as the light-emitting panel 200 (see FIGS. 2A to 2C) except that the structures of the protrusion 225 and a partition 228B are different. Therefore, description is given here of the structures of the protrusion 225 and the partition 228B; for the structures of the other components, refer to the description of the light-emitting panel 200. Note that a cross section along a cutting plane line X1-X2 in FIG. 3A is the same as the cross section shown in FIG. 2C.

The light-emitting panel 200B described in this modification example includes, over the insulating surface 221, the conductive protrusion 225 that has the first sidewall sloping toward the first lower electrode and the second sidewall sloping the second lower electrode.

Furthermore, the light-emitting panel 200B includes the light-transmitting partition 228B that is provided to overlap with the end portion of the first lower electrode 251R, the first sidewall 225s(1), the end portion of the second lower electrode 251G, and the second sidewall 225s(2). Note that in an opening portion 228H, the partition 228B does not cover the first sidewall 225s(1) and the second sidewall 225s(2).

The partition 228B has the opening portion 228H that overlaps with the protrusion 225 (see FIG. 3A). The protrusion 225 is electrically connected to the upper electrode 252 in the opening portion 228H.

In this structure, the conductive protrusion 225 electrically connected to the upper electrode 252 serves as a current path, thereby distributing the current to the upper electrode 252 uniformly. Moreover, voltage drop due to electrical resistance of the upper electrode 252 can be reduced, and current can flow to the upper electrode 252 uniformly.

As a result, a light-emitting panel in which luminance unevenness is reduced can be provided.

In a cross section meeting the insulating surface 221 at a right angle, the protrusion 225 of the light-emitting panel 200B described in this modification example has a wide portion 225W and a narrow portion 225N that is closer to the insulating surface 221 than the wide portion 225W is (see FIG. 3B).

The wide portion 225W of the protrusion 225 can be regarded as forming an eaves shape, and the narrow portion 225N can be regarded as forming a constricted shape.

When the layer 253 containing the light-emitting organic compound is formed, over the insulating surface provided with the protrusion 225, by a film formation method that has high directivity of a film formation rate in a direction perpendicular to the insulating surface, the layer 253 containing the light-emitting organic compound is not formed in the narrow portion 225N, which is shaded by the wide portion 225W.

Then, the upper electrode 252 is formed by a film formation method that has low directivity of a film formation rate, so that the protrusion 225 and the upper electrode 252 can be electrically connected to each other in the narrow portion 225N, which is shaded by the wide portion 225W.

Note that examples of the film formation method that has high directivity of a film formation rate include an evaporation method in which a distance from an evaporation source is approximately 20 cm or more, and examples of the method that has low directivity include a sputtering method.

In the above manner, a shadow mask method is not required. Therefore, it is possible to save an effort required for alignment of a shadow mask in a predetermined position of a substrate, whereby production efficiency can be increased.

Accordingly, the light-emitting panel can have high energy efficiency. Alternatively, in the light-emitting panel, luminance unevenness can be reduced. Alternatively, the light-emitting panel can be fabricated easily.

Hereinafter, the structures of the partition 228B and the protrusion 225 that are used in the light-emitting panel 200B in this embodiment will be described.

<<Protrusion>>

The protrusion 225 used in this modification example has conductivity, which is preferably higher than that of the upper electrode 252.

The protrusion 225 preferably extends along the upper electrode 252.

Examples of a material that can be used for the protrusion 225 include a metal, and an insulating material covered with a metal.

<<Partition>>

The partition 228B can have the same structure as the partition 228 described in Embodiment 1 except that the partition 228B is provided with the opening portion 228H.

The opening portion 228H is provided in a position overlapping with the protrusion 225, so that the protrusion 225 is exposed in the opening portion 228H. FIG. 3A illustrates an example in which the opening portion 228H is surrounded by four light-emitting modules.

Note that a plurality of the opening portions 228H are preferably provided to overlap with one protrusion. With this structure, the upper electrode 252 can be electrically connected to one protrusion 225 in a plurality of positions. The protrusion 225 that has such a connection can supply power or current to the upper electrode 252 uniformly.

The opening portion 228H is preferably provided such that current uniformly flows to the upper electrode 252. For example, the opening portions 228H may be provided regularly or irregularly throughout the entire light-emitting panel 200B.

Specifically, when a wiring capable of supplying power to the upper electrode 252 is unevenly provided on one side of the light-emitting panel, a larger number of the opening portions 228H may be provided in a region more distant from the wiring.

Modification Example 2

A modification example 2 of the light-emitting panel in this embodiment will be described with reference to FIGS. 4A and 4B.

Figure 4A:
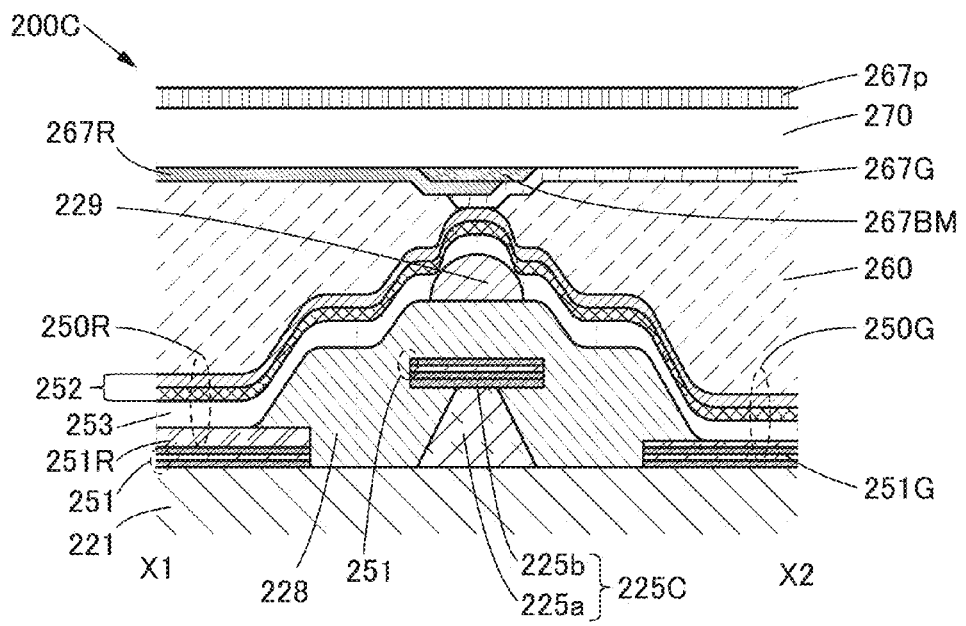
FIGS. 4A and 4B are views illustrating a structure of a light-emitting panel.
Figure 4B:
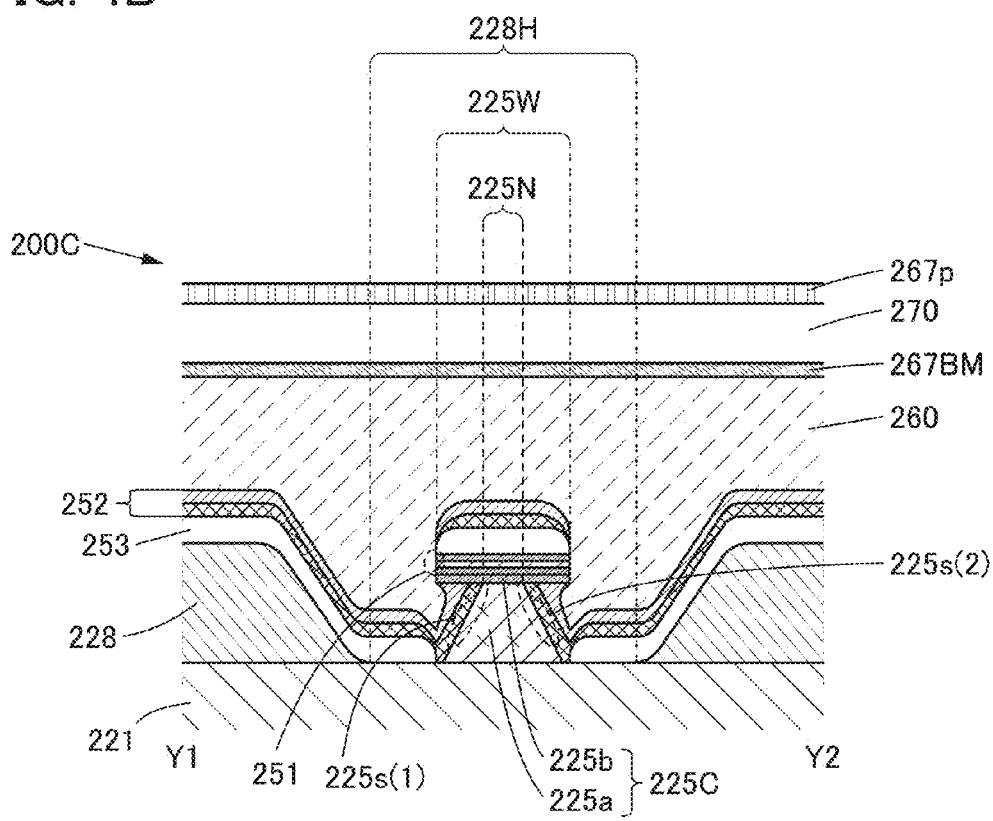

FIGS. 4A and 4B are cross-sectional views illustrating the modification example 2 of the light-emitting panel described in this embodiment.

FIG. 4A is a cross-sectional view along a cutting plane line X1-X2 in FIG. 3A. FIG. 4B is a cross-sectional view along a cutting plane line Y1-Y2 in FIG. 3A.

A light-emitting panel 200C, which is described in the modification example 2 in this embodiment, has the same structure as the light-emitting panel 200B (see FIGS. 3A and 3B) except that the structure of a protrusion 225C is different. Therefore, description is given here of the structure of the protrusion 225C; for the structures of the other components, refer to the description of the light-emitting panel 200B.

The first lower electrode 251R of the light-emitting panel 200C described in this modification example is provided with the reflective film 251 that reflects light emitted from the layer 253 containing the light-emitting organic compound. In addition, the protrusion 225C includes, in the wide portion 225W, a film containing the same material as the reflective film 251 (see FIG. 4B).

Modification Example 3

A modification example 3 of the light-emitting panel in this embodiment will be described with reference to FIGS. 5A and 5B.

Figure 5A:
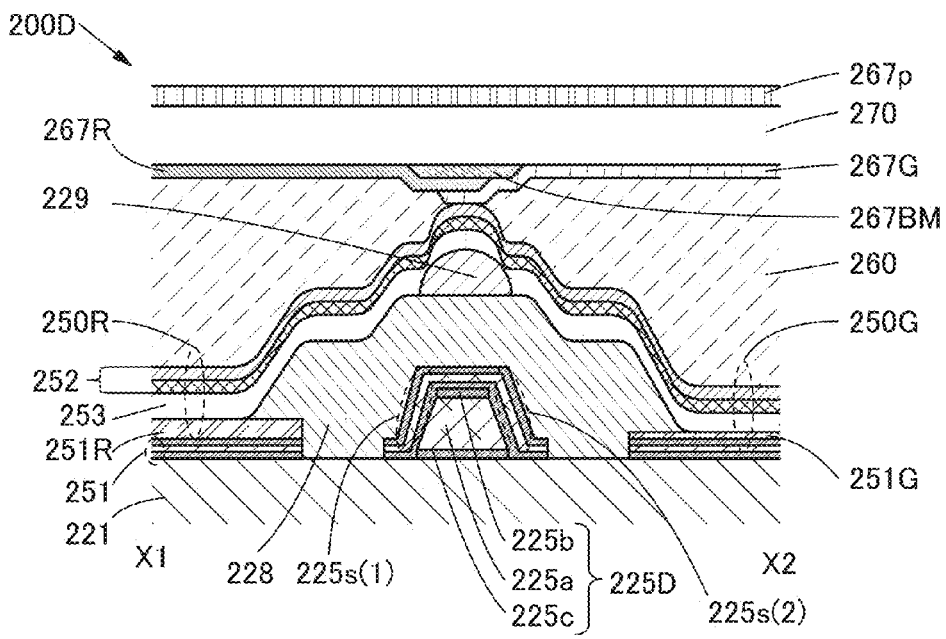
FIGS. 5A and 5B are views illustrating a structure of a light-emitting panel.
Figure 5B:
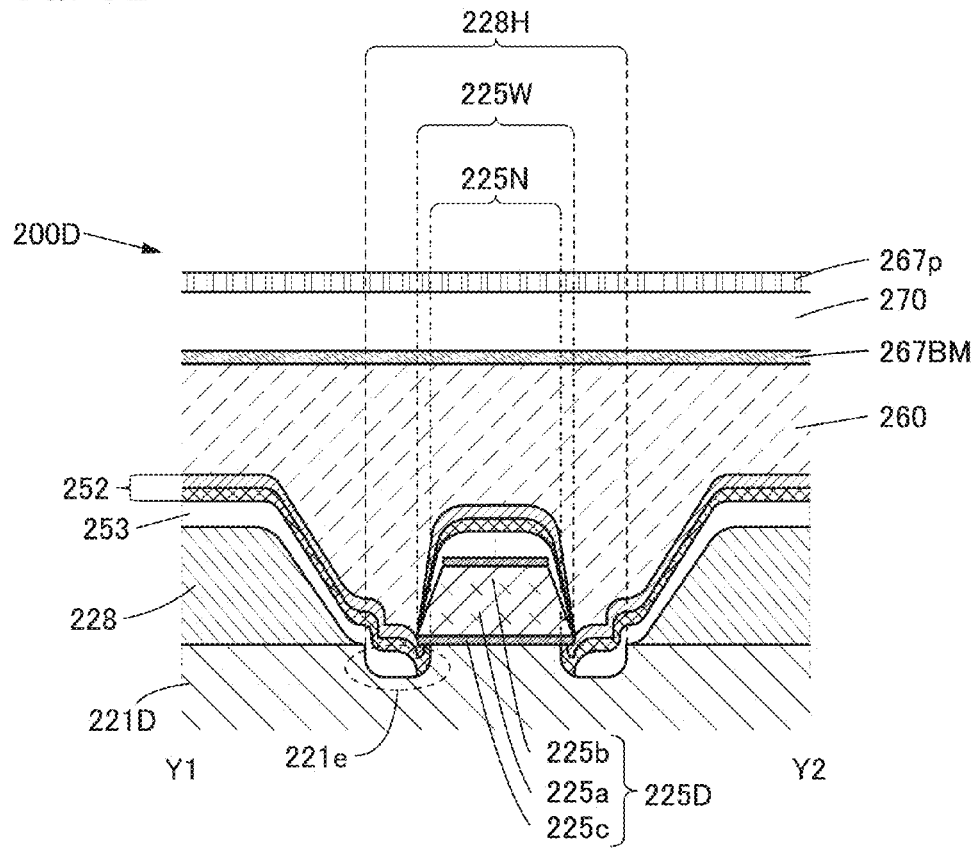

FIGS. 5A and 5B are cross-sectional views illustrating the modification example 3 of the light-emitting panel described in this embodiment.

FIG. 5A is a cross-sectional view along a cutting plane line X1-X2 in FIG. 3A. FIG. 5B is a cross-sectional view along a cutting plane line Y1-Y2 in FIG. 3A.

A light-emitting panel 200D, which is described in the modification example 3 in this embodiment, has the same structure as the light-emitting panel 200B (see FIGS. 3A and 3B) except that the structures of a protrusion 225D and an insulating surface 221D are different. Therefore, description is given here of the protrusion 225D and the insulating surface 221D; for the structures of the other components, refer to the description of the light-emitting panel 200B.

The first lower electrode 251R of the light-emitting panel 200D described in this modification example is provided with the reflective film 251 that reflects light emitted from the layer 253 containing the light-emitting organic compound. Furthermore, the protrusion 225D includes, in the sidewall 225s(1), a film containing the same material as the reflective film 251 (see FIG. 5A).

The first lower electrode 251R and the sidewall of the protrusion 225D each include a material that has a high reflectivity (e.g., 80% or more, preferably 90% or more, further preferably 98% or more) of light emitted from the layer 253 containing the light-emitting organic compound. Accordingly, light entering the partition is reflected to exit the partition, which prevents a phenomenon in which the light is considerably attenuated or lost in the partition.

The light-emitting panel 200D includes, in the opening portion 228H of the partition 228, the insulating surface 221D that is provided with a recessed portion 221e. Note that the recessed portion 221e extends under the protrusion 225D so that they partly overlap with each other. Thus, in the light-emitting panel 200D are provided the wide portion 225W that includes the protrusion 225D and the narrow portion 225N that is formed by the insulating surface 221D adjacent to the recessed portion 221e.

The wide portion 225W can be regarded as forming an eaves shape, and the narrow portion 225N can be regarded as forming a constricted shape.

Modification Example 4

A modification example 4 of the light-emitting panel in this embodiment will be described with reference to FIGS. 12A, 12B1, 12B2, and 12C.

FIGS. 12A, 12B1, 12B2, and 12C are cross-sectional views illustrating the modification example 4 of the light-emitting panel described in this embodiment.

FIG. 12A is a cross-sectional view along the cutting plane line X1-X2 in FIG. 3A. FIG. 12B1 and FIG. 12B2 are each a cross-sectional view along the cutting plane line Y1-Y2 in FIG. 3A.

A light-emitting panel 200E, which is described in the modification example 4 in this embodiment, has the same structure as the light-emitting panel 200B (see FIGS. 3A and 3B) except that the structures of a protrusion 225E and the insulating surface 221E are different. Therefore, description is given here of the structures of the protrusion 225E and the insulating surface 221E; for the structures of the other components, refer to the description of the light-emitting panel 200B.

The first lower electrode 251R of the light-emitting panel 200E described in this modification example is provided with the reflective film 251 that has conductivity and reflects light emitted from the layer 253 containing the light-emitting organic compound. Furthermore, the protrusion 225E includes a core portion 225e that contains a resin and a film that contains the same material as the reflective film 251 in the sidewall 225s(1) (see FIG. 12A).

The first lower electrode 251R and the sidewall of the protrusion 225E each include a material that has a high reflectivity (e.g., 80% or more, preferably 90% or more, further preferably 98% or more) of light emitted from the layer 253 containing the light-emitting organic compound over the lower electrode. Accordingly, light entering the partition 228 is reflected to exit the partition 228, which prevents a phenomenon in which the light is considerably attenuated or lost in the partition.

Because a resin is used for the core portion 225e of the protrusion 225E, the protrusion 225 can be easily made tall as compared to the case where a metal is used. As examples of a resin that can be used for the core portion 225e, a polyester, a polyolefin, a polyamide, a polyimide, a polycarbonate, an acrylic resin, and a composite material of a plurality of kinds of resins selected from these can be given. A photosensitive resin can also be used.

In the light-emitting panel 200E, the protrusion 225E is provided inside the light-transmitting partition 228. The film that contains the same material as the reflective film 251 and that is included in the sidewall 225s(1) of the protrusion 225E is separated and electrically isolated from the first lower electrode 251R.

A light-emitting panel 200E(2) described in the modification example 4 in this embodiment includes a protrusion 225E(2) inside the light-transmitting partition 228 (see FIG. 12C). FIG. 12C is a cross-sectional view along the cutting plane line X1-X2 in FIG. 3A.

The protrusion 225E(2) includes the insulating core portion 225e containing a resin or the like; the reflective film 251 extended from the first lower electrode 251R side and included in the sidewall 225s(1); and the reflective film 251 extended from the second lower electrode 251G side and included in the sidewall 225s(2). Note that the reflective film 251 in the sidewall 225s(1) and the reflective film 251 in the sidewall 225s(2) are separated to be electrically isolated from each other. With this structure, a distance between the protrusion and each of the lower electrodes can be small.

Accordingly, the area of the partition 228 can be small and that of the light-emitting element can be large.

In the opening portion 228H of the partition 228 in the light-emitting panel 200E(2), the reflective film 251 extends from a lower end of the core portion 225e to overlap with the recessed portion 221e of the insulating surface 221E (see FIG. 12B1).

Furthermore, the light-emitting panel 200E includes, in the opening portion 228H of the partition 228, the insulating surface 221E provided with the recessed portion 221e.

Thus, in the light-emitting panel 200E are provided the wide portion 225W that includes the extending film containing the same material as the reflective film 251 and the narrow portion 225N that is formed by the insulating surface 221E adjacent to the recessed portion 221e.

Note that in another modification example of the light-emitting panel 200E, the wide portion 225W and the narrow portion 225N can be formed by using a reflective film in which a film with a high etching rate is stacked on the substrate side (see FIG. 12B2). In this case, the recessed portion is not necessarily provided in the insulating surface.

This embodiment can be combined with any of the other embodiments in this specification as appropriate.

Embodiment 3

In this embodiment, a method for fabricating a light-emitting panel of one embodiment of the present invention will be described with reference to FIGS. 6A1 to 6E1 and FIGS. 6A2 to 6E2, FIGS. 7A1 to 7E1 and FIGS. 7A2 to 7E2, and FIGS. 8A1 to 8E1 and FIGS. 8A2 to 8E2.

FIGS. 6A1 to 6E1 and FIGS. 6A2 to 6E2 are cross-sectional views illustrating a method for fabricating a protrusion and a partition that can be used for a light-emitting panel of one embodiment of the present invention. Specifically, a method for fabricating the protrusion 225 and the partition 228B that can be used for the light-emitting panel 200B is illustrated.

Note that FIGS. 6A1 to 6E1 each show a cross section along the cutting plane line X1-X2 in the top view of FIG. 3A, and FIGS. 6A2 to 6E2 each show a cross section along the cutting plane line Y1-Y2 in the top view of FIG. 3A.

In this embodiment, a case where the protrusion 225 and the partition 228B are fabricated over the insulating surface 221 of an insulating film formed over a glass substrate will be described with reference to FIGS. 6A1 to 6E1 and FIGS. 6A2 to 6E2. Note that pixel circuits may be provided over the glass substrate. Furthermore, opening portions for electrical connection between the pixel circuits and the lower electrodes may be provided in the insulating film.

<First Step>

The reflective films 251 are formed in the first step.

A film that reflects visible light is formed over the insulating surface 221. For example, a metal film is formed by a sputtering method or the like.

Specifically, by a sputtering method, a 50-nm-thick titanium film, a 200-nm-thick aluminum film, and a 5-nm-thick titanium film are stacked in that order in the opening portion of the insulating film and over the insulating surface 221 of the insulating film.

Then, a resist mask is formed using a first photomask. An unnecessary portion is removed by an etching method, whereby the reflective films 251 are formed. Note that the reflective films 251 are electrically connected to the pixel circuits in the opening portions to supply power to the lower electrodes that are formed later.

<Second Step>

In the second step, a protective film 223 is formed to cover the reflective films 251 (see FIGS. 6A1 and 6A2).

Note that the protective film 223 is a film for protecting the reflective films 251 in the third step for forming the protrusion 225. Because the protective film 223 is selectively removed after formation of the protrusion 225, a material that can be selectively removed from the reflective films 251 is used for the protective film 223. As an example of the material that can be used for the protective film 223, a metal oxide can be given.

The protective film 223 is formed by, for example, forming a film to be the protective film 223 by a CVD method or a sputtering method.

Specifically, a 100-nm-thick film of indium tin oxide containing silicon is formed by a sputtering method to cover the reflective films 251.

<Third Step>

In the third step, a protrusion with a sloping sidewall is formed over the protective film 223 (see FIGS. 6B1 and 6B2).

A film that reflects visible light is formed over the protective film 223 by a sputtering method or the like. For example, it is possible to use a metal having a high reflectivity of visible light such as aluminum or silver. It is also possible to stack a metal with a high melting point (e.g., titanium or molybdenum) over a metal having a high reflectivity of visible light. Note that in this embodiment, a film 225a and films 225b and 225c that are not easily etched as compared to the film 225a are stacked. Accordingly, the film 225a can be formed into the narrow portion and the film 225b can be formed into the wide portion in the fourth step.

Specifically, by a sputtering method, a 100-nm-thick titanium film, a 1000-nm-thick aluminum film, and a 100-nm-thick titanium film are stacked in that order as the film 225c, the film 225a, and the film 225b, respectively, over the protective film 223.

Then, a resist mask 291 is formed using a second photomask. An unnecessary portion of the film that reflects visible light is removed by an etching method, whereby the protrusion 225 having the sloping sidewall is formed.

Note that the resist mask 291 is formed such that an end portion of the resist mask 291 has a gradually decreasing thickness to have a gentle slope. To form the resist mask 291 having such a shape, for example, the thickness of the resist mask 291 is set small and/or the baking temperature is set high. By the use of the resist mask 291 with such a shape, the films 225a, 225b, and 225c can be removed while the end portion of the resist mask 291 is made to recede. As a result, the protrusion 225 having the sloping sidewall can be provided.

Next, the resist mask 291 is removed, which is followed by removal of the protective film 223 in a portion that does not overlap with the protrusion 225.

<Fourth Step>

In the fourth step, the wide portion 225W and the narrow portion 225N are formed in the protrusion 225 (see FIGS. 6C1 and 6C2).

A resist mask is formed using a third photomask to protect the reflective films 251.

Then, the film 225a to be the narrow portion is selectively etched, whereby the narrow portion 225N is formed. Because the film 225b is not easily etched, the wide portion 225W is formed.

Specifically, the 1000-nm-thick aluminum film is etched with an etchant containing a nitric acid, an acetic acid, or a phosphoric acid. Because etching proceeds isotropically in wet etching, the sloping sidewall can be made to recede.

<Fifth Step>

In the fifth step, the lower electrodes are formed (see FIGS. 6D1 and 6D2).

Note that this embodiment describes the case where the first lower electrode 251R with a thickness of 82 nm is formed by stacking a 37-nm-thick first layer, a 40-nm-thick second layer, and a 5-nm-thick third layer; the second lower electrode 251G with a thickness of 45 nm is formed by stacking the second layer and the third layer; and an unshown third lower electrode with a thickness of 5 nm is formed of the third layer.

A conductive film with a light-transmitting property to be the first layer is formed over the reflective film 251 by a sputtering method, a sol-gel method, or the like.

Specifically, a 37-nm-thick film of indium tin oxide containing silicon is formed by a sputtering method to cover the reflective film 251.

Then, a resist mask is formed using a fourth photomask. An unnecessary portion is removed by an etching method, whereby the first layer is formed to overlap with the reflective film 251 over which the first lower electrode 251R is to be formed.

A conductive film with a light-transmitting property to be the second layers is formed over the first layer and the reflective films 251 by a sputtering method, a sol-gel method, or the like.

Specifically, a 40-nm-thick film of indium tin oxide containing silicon is formed by a sputtering method to cover the first layer and the reflective films 251.

Then, a resist mask is formed using a fifth photomask. An unnecessary portion is removed by an etching method, whereby the second layers are formed to overlap with the reflective films 251 over which the first lower electrode 251R and the second lower electrode 251G are to be formed.

A conductive film with a light-transmitting property to be the third layers is formed over the second layer and the reflective films 251 by a sputtering method, a sol-gel method, or the like.

Specifically, a 5-nm-thick film of indium tin oxide containing silicon is formed by a sputtering method to cover the second layer and the reflective films 251.

Then, a resist mask is formed using a sixth photomask. An unnecessary portion is removed by an etching method, whereby the third layers are formed to overlap with the reflective films 251 over which the first lower electrode 251R, the second lower electrode 251G, and the unshown third lower layer are to be formed (see FIGS. 6D1 and 6D2).

<Sixth Step>

In the sixth step, the light-transmitting partition 228 is formed to overlap with the end portions of the lower electrodes and the sidewall of the protrusion 225. The spacer 229 is also formed to overlap with the partition 228.

A film that transmits visible light and is to be the partition 228 is formed to cover the end portions of the first lower electrode 251R, the second lower electrode 251G, and the unshown third lower electrode and the sidewall of the protrusion 225. For example, an organic film is formed by a coating method, a printing method, an ink-jet method, or the like. Alternatively, an inorganic film is formed by a sol-gel method, a CVD method, or the like.

Specifically, a film containing a photosensitive polyimide is formed; then, with the use of a seventh photomask, opening portions are formed in positions overlapping with the first lower electrode 251R, the second lower electrode 251G, the third lower electrode, and the protrusion 225. Note that the partition 228 has a thickness of, for example, 1.5 μm.

The spacer 229 can be formed using a material and a method similar to those used for the partition 228.

Specifically, the spacer 229 is formed in a position overlapping with the partition 228 by the use of a film containing a photosensitive polyimide and an eighth photomask (see FIGS. 6E1 and 6E2). Note that the spacer 229 reaches a height of, for example, 2.0 μm.

By a method involving the above first to sixth steps, the protrusion 225 and the partition 228 that can be used for the light-emitting panel 200B can be fabricated.

<Seventh Step>

In the seventh step, the first light-emitting element 250R is fabricated using the first lower electrode 251R, and the second light-emitting element 250G is fabricated using the second lower electrode 251G (see FIG. 2C). Note that details about materials that can be used for the light-emitting elements and a fabrication method thereof are described in Embodiment 5.

The layer 253 containing the light-emitting organic compound and the semi-transmissive and semi-reflective upper electrode 252 are formed in that order over the lower electrodes.

For example, the layer 253 containing the light-emitting organic compound can be formed by stacking a first light-emitting unit, an intermediate layer, and a second light-emitting unit in that order on the lower electrode side.

For example, the layer 253 containing the light-emitting organic compound is formed over the insulating surface 221 provided with the protrusion 225, by the use of a method with high directivity in a direction perpendicular to the insulating surface 221. Thus, the layer 253 containing the light-emitting organic compound is not formed in the narrow portion 225N shaded by the wide portion 225W (see FIG. 3B).

Note that examples of the film formation method with high directivity include an evaporation method in which a distance from an evaporation source is approximately 20 cm or more, and examples of the method with low directivity include a sputtering method.

Furthermore, in the first light-emitting unit, a layer that contains a fluorescent organic compound emitting blue light is provided; and in the second light-emitting unit, a layer that contains a phosphorescent organic compound emitting green light and a layer that contains a phosphorescent organic compound emitting red light are provided in that order.

The upper electrode 252 can be formed in the following manner, for example: a metal thin film is formed to have a thickness that is small enough to allow light transmission, and a metal oxide film having a light-transmitting property and conductivity is stacked thereover.

Specifically, magnesium and silver are deposited by co-evaporation to a thickness of 5 nm, and then, an indium tin oxide film is formed to a thickness of 70 nm by a sputtering method. Note that a sputtering method has low directivity; thus, the protrusion 225 and the upper electrode 252 can be electrically connected to each other in the narrow portion 225N shaded by the wide portion 225W.

<Eighth Step>

In the eighth step, the light-emitting element and the optical bonding layer 260 that is in contact with the light-emitting element and the counter substrate 270 are sealed between the insulating surface 221 and the counter substrate 270 (see FIG. 3B).

A sealant is provided on the insulating surface 221 and/or the counter substrate 270 to surround the light-emitting element. Then, the insulating surface 221 and the counter substrate 270 are bonded to each other with the use of the sealant, so that the light-emitting element is sealed between the insulating surface 221 and the counter substrate 270.

For example, the counter substrate 270 provided with a glass layer with a low melting point is prepared. The glass layer is formed such that it surrounds the light-emitting element. The counter substrate 270 is placed such that the insulating surface 221 is in contact with the sealant and the light-emitting element is positioned between the insulating surface 221 and the counter substrate 270. In this state, the sealant is irradiated with a laser beam to melt glass with a low melting point contained in the sealant, whereby the insulating surface 221 and the counter substrate 270 are fused together to be sealed.

Alternatively, a fluid material that is used for the optical bonding layer 260 is applied to the light-emitting element and/or the counter substrate 270 by an ink-jet method, a dropping method, a coating method, a printing method, or the like. Then, the insulating surface 221 and the counter substrate 270 are bonded to each other with the use of the sealant, whereby the fluid material is sealed together with the light-emitting element.

Note that the coloring layer 267R, the coloring layer 267G, and the light-blocking layer 267BM can be formed on the counter substrate 270 by a photolithography method, an ink-jet method, a printing method, or the like.

The layer containing glass with a low melting point can be formed using a paste layer formed by a dispenser or a screen printing method and containing an organic material and glass with a low melting point. For example, the organic material contained in the paste layer can be burnt off when the paste layer is irradiated with semiconductor laser to be locally heated. In the case where this method is employed, the layer containing glass with a low melting point can be formed after formation of the coloring layers and the light-blocking layer.

Modification Example 1

A modification example of a method for fabricating the light-emitting panel in this embodiment will be described with reference to FIGS. 7A1 to 7E1 and FIGS. 7A2 to 7E2.

FIGS. 7A1 to 7E1 and FIGS. 7A2 to 7E2 are cross-sectional views illustrating a method for fabricating a protrusion and a partition that can be used for a light-emitting panel of one embodiment of the present invention. Specifically, a method for fabricating the protrusion 225C that can be used for the light-emitting panel 200C described with reference to FIGS. 4A and 4B is illustrated.

Note that FIGS. 7A1 to 7E1 each show a cross section along the cutting plane line X1-X2 in the top view of FIG. 3A, and FIGS. 7A2 to 7E2 each show a cross section along the cutting plane line Y1-Y2 in the top view of FIG. 3A.

The method for fabricating the light-emitting panel that is described in this modification example is different from the method for fabricating the light-emitting panel 200B that is described with reference to FIGS. 6A1 to 6E1 and FIGS. 6A2 to 6E2 in that the protrusion 225C is formed before formation of the reflective films 251 and that the wide portion 225W includes the reflective film 251. Thus, description is given here of different steps, and for the steps that are the same as those in the method for fabricating the light-emitting panel 200B, refer to description of the fabrication method.

<First Step>

In the first step, the protrusion 225C having a sloping sidewall is formed over the insulating surface 221 (see FIGS. 7A1 and 7A2).

This step can be performed in a manner similar to that of the third step of the method for fabricating the light-emitting panel 200B described with reference to FIGS. 6A1 to 6E1 and FIGS. 6A2 to 6E2.

Note that in this modification example, the resist mask 291 is formed using the first photomask.

<Second Step>

In the second step, the reflective films 251 are formed (see FIGS. 7B1 and 7B2).

This step can be performed in a manner similar to that of the first step of the method for fabricating the light-emitting panel 200B described with reference to FIGS. 6A1 to 6E1 and FIGS. 6A2 to 6E2.

Note that in this modification example, a resist mask is formed using the second photomask.

<Third Step>

In the third step, the lower electrodes are formed (see FIGS. 7C1 and 7C2).

This step can be performed in a manner similar to that of the fifth step of the method for fabricating the light-emitting panel 200B described with reference to FIGS. 6A1 to 6E1 and FIGS. 6A2 to 6E2.

Note that in this modification example, resist masks are formed using the third to fifth photomasks.

<Fourth Step>

In the fourth step, the wide portion 225W and the narrow portion 225N are formed in the protrusion 225C (see FIGS. 6C1 and 6C2).

This step can be performed in a manner similar to that of the fourth step of the method for fabricating the light-emitting panel 200B described with reference to FIGS. 6A1 to 6E1 and FIGS. 6A2 to 6E2.

Note that in this modification example, a resist mask is formed using the sixth photomask.

<Fifth Step>

In the fifth step, the light-transmitting partition 228 is formed to overlap with the end portions of the lower electrodes and the sidewall of the protrusion 225. The spacer 229 is also formed to overlap with the partition 228.

The fifth and subsequent steps can be performed in manners similar to those of the sixth and subsequent steps of the method for fabricating the light-emitting panel 200B described with reference to FIGS. 6A1 to 6E1 and FIGS. 6A2 to 6E2.

Note that in this modification example, a resist mask is formed using the seventh photomask.

Modification Example 2

A modification example of a method for fabricating the light-emitting panel in this embodiment will be described with reference to FIGS. 8A1 to 8E1 and FIGS. 8A2 to 8E2.

FIGS. 8A1 to 8E1 and FIGS. 8A2 to 8E2 are cross-sectional views illustrating a method for fabricating a protrusion and a partition that can be used for a light-emitting panel of one embodiment of the present invention. Specifically, a method for fabricating the protrusion 225D and the partition 228 that can be used for the light-emitting panel 200D described with reference to FIGS. 5A and 5B is illustrated.

Note that FIGS. 8A1 to 8E1 each show a cross section along the cutting plane line X1-X2 in the top view of FIG. 3A, and FIGS. 8A2 to 8E2 each show a cross section along the cutting plane line Y1-Y2 in the top view of FIG. 3A.

<First Step>

In the first step, the protrusion 225D having a sloping sidewall is formed over the insulating surface 221 (see FIGS. 8A1 and 8A2).

This step can be performed in a manner similar to that of the third step of the method for fabricating the light-emitting panel 200B described with reference to FIGS. 6A1 to 6E1 and FIGS. 6A2 to 6E2.

Note that in this modification example, the resist mask 291 is formed using the first photomask.

<Second Step>

In the second step, the reflective films 251 are formed (see FIGS. 8B1 and 8B2).

This step can be performed in a manner similar to that of the first step of the method for fabricating the light-emitting panel 200B described with reference to FIGS. 6A1 to 6E1 and FIGS. 6A2 to 6E2.

Note that in this modification example, a resist mask is formed using the second photomask.

<Third Step>

In the third step, the lower electrodes are formed (see FIGS. 8C1 and 8C2).

This step can be performed in a manner similar to that of the fifth step of the method for fabricating the light-emitting panel 200B described with reference to FIGS. 6A1 to 6E1 and FIGS. 6A2 to 6E2.

Note that in this modification example, resist masks are formed using the third to fifth photomasks.

<Fourth Step>

In the fourth step, the light-transmitting partition 228 is formed to overlap with the end portions of the lower electrodes and the sidewall of the protrusion 225D. The spacer 229 is also formed to overlap with the partition 228 (see FIGS. 8D1 and 8D2).

The fifth step can be performed in a manner similar to that of the sixth step of the method for fabricating the light-emitting panel 200B described with reference to FIGS. 6A1 to 6E1 and FIGS. 6A2 to 6E2.

Note that in this modification example, a resist mask is formed using the sixth photomask.

<Fifth Step>

In the fifth step, the insulating surface 221 is partly removed using the partition 228 as a mask (see FIGS. 8E1 and 8E2).

For example, part of the insulating surface 221 is removed by ashing, so that the recessed portion 221e can be formed.

By a method involving the above first to fifth steps, the protrusion 225D and the insulating surface 221D that can be used for the light-emitting panel 200D can be fabricated.

<Sixth Step>

In the sixth step, the first light-emitting element 250R is fabricated using the first lower electrode 251R, and the second light-emitting element 250G is fabricated using the second lower electrode 251G (see FIG. 5A). Note that details about materials that can be used for the light-emitting elements and a fabrication method thereof are described in Embodiment 5.

The sixth and subsequent steps can be performed in manners similar to those of the sixth and subsequent steps of the method for fabricating the light-emitting panel 200B described with reference to FIGS. 6A1 to 6E1 and FIGS. 6A2 to 6E2.

This embodiment can be combined with any of the other embodiments in this specification as appropriate.

Embodiment 4

In this embodiment, a structure of a light-emitting device of one embodiment of the present invention will be described with reference to FIGS. 9A to 9C.

Figure 9A:
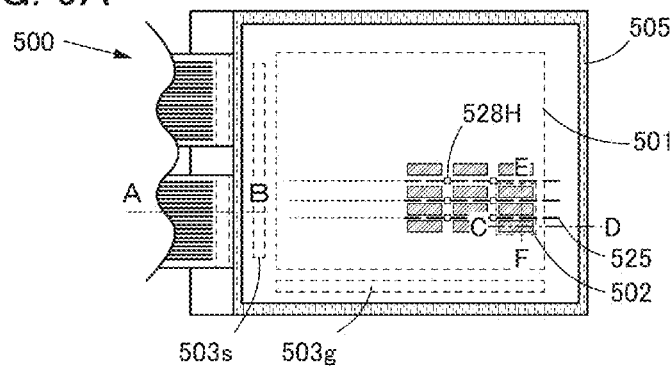
FIGS. 9A to 9C are views illustrating a structure of a light emitting device.

FIG. 9A is a top view illustrating a structure of a light-emitting device of one embodiment of the present invention.

Figure 9B:
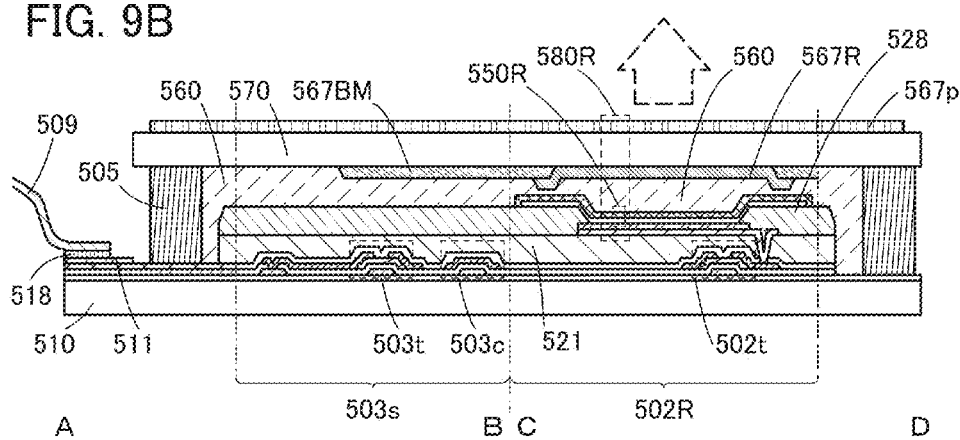

FIG. 9B is a top view of an enlarged part of FIG. 9A.

<Top View>

A light-emitting device 500 described in this embodiment includes a display region 501 (see FIG. 9A).

A plurality of pixels 502 are included in the display region 501, and each of the pixels 502 includes a plurality of subpixels. Each of the subpixels includes a light-emitting module and a pixel circuit that can supply power for driving the light-emitting module.

In the display region 501, a protrusion 525 extends in one direction and a plurality of opening portions 528H are provided along one protrusion.

The pixel circuit is electrically connected to a wiring that can supply a selection signal and a wiring that can supply a data signal.

The light-emitting device 500 is also provided with a scanning line driver circuit 503g that can supply a selection signal and a data line driver circuit 503s that can supply a data signal.

<Cross-Sectional View>

The light-emitting device 500 includes a substrate 510 and a counter substrate 570 facing the substrate 510 (see FIG. 9B). The light-emitting device 500 also includes a subpixel 502R and the data line driver circuit 503s. The counter substrate 570 and the substrate 510 are bonded with the use of a sealant 505. Furthermore, the pixel circuit and a first light-emitting element 550R are provided between the substrate 510 and the counter substrate 570.

<<Subpixel>>

In the light-emitting device 500, the counter substrate 570 is provided with a first coloring layer 567R. Note that the first coloring layer 567R is positioned to overlap with the first light-emitting element 550R. With this structure, light emitted from the first light-emitting element 550R is partly transmitted through an optical bonding layer 560 and the first coloring layer 567R to exit the light-emitting device 500.

In the light-emitting device 500, the counter substrate 570 is provided with a light-blocking layer 567BM. The light-blocking layer 567BM is provided to surround the first coloring layer 567R.

In the light-emitting device 500, the optical bonding layer 560 is provided in contact with the first light-emitting element 550R and the first coloring layer 567R.

The first light-emitting element 550R, the optical bonding layer 560, and the first coloring layer 567R form a light-emitting module 580R.

Note that in the light-emitting device 500, an anti-reflection layer 567p is provided to overlap with the display region 501.

In the subpixel 502R, the pixel circuit that can supply power to the light-emitting module 580R and includes a transistor 502t is provided.

In the light-emitting device 500, the first light-emitting element 550R is provided over an insulating film 521. The insulating film 521 is provided to cover the transistor 502t. Note that the insulating film 521 can be used as a layer for planarizing unevenness due to the pixel circuit. For the insulating film 521, an insulating film including stacked layers that can prevent dispersion of impurities to the transistor 502t and the like can be used.

Figure 9C:
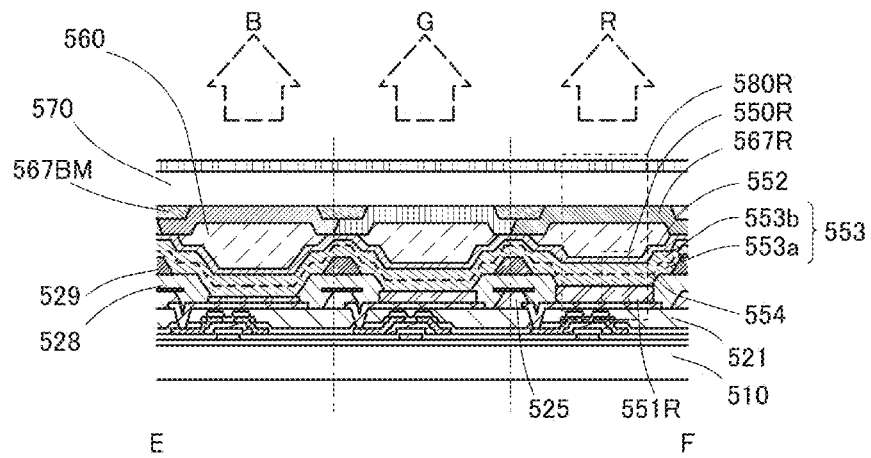

The light-emitting device 500 includes, over the insulating film 521, a first lower electrode 551R, the protrusion 525 with a sidewall sloping toward the first lower electrode 551R, and a light-transmitting partition 528 overlapping with an end portion of the first lower electrode 551R and the sidewall of the protrusion 525 (see FIG. 9C).

Note that the light-emitting module 580R includes the first lower electrode 551R, an upper electrode 552, and a layer 553 containing a light-emitting organic compound between the first lower electrode 551R and the upper electrode 552. Furthermore, the layer 553 containing the light-emitting organic compound includes a first light-emitting unit 553a, a second light-emitting unit 553b, and an intermediate layer 554 between the first light-emitting unit 553a and the second light-emitting unit 553b.

<<Data Line Driver Circuit>>

The data line driver circuit 503s includes a transistor 503t and a capacitor 503c. Note that the driver circuit and the pixel circuit can be formed over the same substrate by the same steps.

<<Other Components>>

The light-emitting device 500 includes a wiring 511 that can supply a signal, and a terminal 518 is provided on the wiring 511. Note that a flexible printed circuit (FPC) 509 that can supply a data signal, a synchronization signal, and other signals is electrically connected to the terminal 518.

The light-emitting device in this specification includes, in its category, not only the light-emitting device itself but also the light-emitting device provided with an FPC or a PWB.

This embodiment can be combined with any of the other embodiments in this specification as appropriate.

Embodiment 5

In this embodiment, a structure of a light-emitting element that can be used for the light-emitting module according to one embodiment of the present invention will be described. Specifically, an example of a light-emitting element in which a layer containing a light-emitting organic compound is provided between a pair of electrodes will be described with reference to FIGS. 10A to 10E.

The light-emitting element described in this embodiment as an example includes a lower electrode, an upper electrode, and a layer containing a light-emitting organic compound (hereinafter referred to as an EL layer) provided between the lower electrode and the upper electrode. One of the lower and upper electrodes functions as an anode, and the other functions as a cathode. The EL layer is provided between the lower electrode and the upper electrode, and a structure of the EL layer may be appropriately determined in accordance with materials of the lower electrode and the upper electrode. Examples of the structure of the light-emitting element will be described below; needless to say, the structure of the light-emitting element is not limited to the examples.

Structure Example 1 of Light-Emitting Element

Figure 10A:
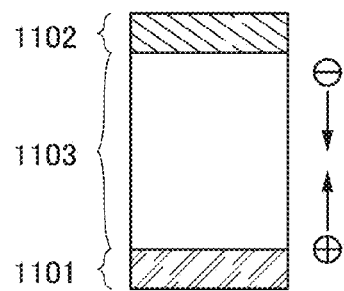
FIGS. 10A to 10E are views each illustrating a light-emitting element.

An example of a structure of a light-emitting element is illustrated in FIG. 10A. In the light-emitting element illustrated in FIG. 10A, an EL layer is provided between an anode 1101 and a cathode 1102.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer or a stacked body that includes one region where electrons and holes injected from both ends are recombined is referred to as a light-emitting unit. Therefore, it can be said that Structure Example 1 of the light-emitting element includes one light-emitting unit.

A light-emitting unit 1103 includes at least a light-emitting layer containing a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (substance that blocks holes), a substance having a high electron-transport property, a substance having a high electron-injection property, and a substance having a bipolar property (substance having high electron- and hole-transport properties).

Figure 10B:
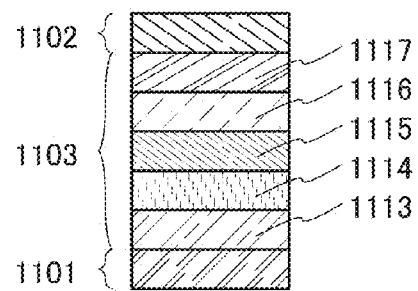

An example of a specific structure of the light-emitting unit 1103 is illustrated in FIG. 10B. In the light-emitting unit 1103 illustrated in FIG. 10B, a hole-injection layer 1113, a hole-transport layer 1114, a light-emitting layer 1115, an electron-transport layer 1116, and an electron-injection layer 1117 are stacked in that order from the anode 1101 side.

Structure Example 2 of Light-Emitting Element

Figure 10C:
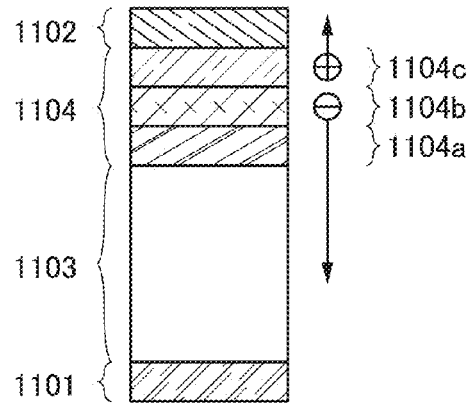

Another example of the structure of the light-emitting element is illustrated in FIG. 10C. In the light-emitting element illustrated in FIG. 10C, an EL layer including the light-emitting unit 1103 is provided between the anode 1101 and the cathode 1102. Furthermore, an intermediate layer 1104 is provided between the cathode 1102 and the light-emitting unit 1103. Note that a structure similar to that of the light-emitting unit in Structure Example 1 of the light-emitting element, which is described above, can be applied to the light-emitting unit 1103 in Structure Example 2 of the light-emitting element and that the description of Structure Example 1 of the light-emitting element can be referred to for the details.

The intermediate layer 1104 is formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in that order from the cathode 1102 side.

The behavior of electrons and holes in the intermediate layer 1104 will be described. When voltage higher than the threshold voltage of the light-emitting element is applied between the anode 1101 and the cathode 1102, holes and electrons are generated in the first charge generation region 1104c, and the holes move into the cathode 1102 and the electrons move into the electron-relay layer 1104b. The electron-relay layer 1104b has a high electron-transport property and immediately transfers the electrons generated in the first charge generation region 1104c to the electron-injection buffer 1104a. The electron-injection buffer 1104a can reduce a barrier against electron injection into the light-emitting unit 1103, so that the efficiency of the electron injection into the light-emitting unit 1103 can be improved. Thus, the electrons generated in the first charge generation region 1104c are injected into the LUMO level of the light-emitting unit 1103 through the electron-relay layer 1104b and the electron-injection buffer 1104a.

In addition, the electron-relay layer 1104b can prevent interaction in which the substance contained in the first charge generation region 1104c and the substance included in the electron-injection buffer 1104a react with each other at the interface therebetween to impair the functions of the electron-injection buffer 1104a and the first charge generation region 1104c.

The range of choices of materials that can be used for the cathode in Structure Example 2 of the light-emitting element is wider than that of materials that can be used for the cathode in Structure Example 1 of the light-emitting element. This is because the cathode in Structure Example 2 can be formed using a material having a relatively high work function as long as the cathode receives holes generated in the intermediate layer.

Structure Example 3 of Light-Emitting Element

Figure 10D:
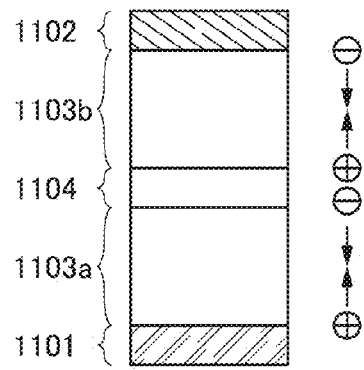
Figure 10E:
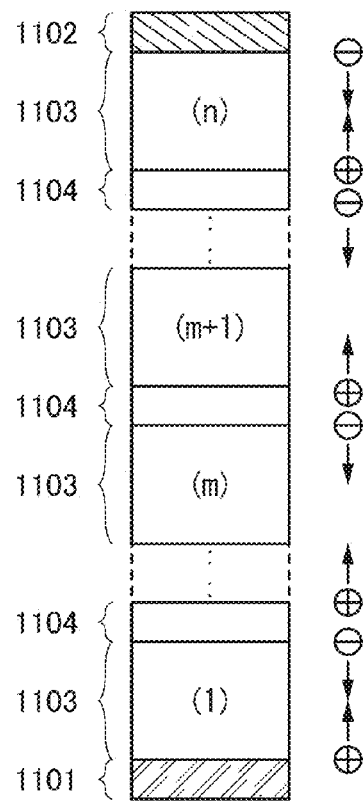

Another example of a structure of a light-emitting element is illustrated in FIG. 10D. In the light-emitting element illustrated in FIG. 10D, an EL layer including two light-emitting units is provided between the anode 1101 and the cathode 1102. Furthermore, the intermediate layer 1104 is provided between a first light-emitting unit 1103a and a second light-emitting unit 1103b.

Note that the number of the light-emitting units provided between the anode and the cathode is not limited to two. A light-emitting element illustrated in FIG. 10E has a structure in which a plurality of light-emitting units 1103 are stacked, that is, a so-called tandem structure. Note that in the case where n (n is a natural number greater than or equal to 2) light-emitting units 1103 are provided between the anode and the cathode, the intermediate layer 1104 is provided between an m-th (m is a natural number greater than or equal to 1 and less than or equal to n−1) light-emitting unit and an (m+1)-th light-emitting unit.

Note that a structure similar to that in Structure Example 1 of the light-emitting element can be applied to the light-emitting unit 1103 in Structure Example 3 of the light-emitting element; a structure similar to that in Structure Example 2 of the light-emitting element can be applied to the intermediate layer 1104 in Structure Example 3 of the light-emitting element. Therefore, the description of Structure Example 1 of the light-emitting element or the description of Structure Example 2 of the light-emitting element can be referred to for the details.

The behavior of electrons and holes in the intermediate layer 1104 provided between the light-emitting units will be described. When voltage higher than the threshold voltage of the light-emitting element is applied between the anode 1101 and the cathode 1102, holes and electrons are generated in the intermediate layer 1104, and the holes move into the light-emitting unit provided on the cathode 1102 side and the electrons move into the light-emitting unit provided on the anode side. The holes injected into the light-emitting unit provided on the cathode side are recombined with the electrons injected from the cathode side, so that a light-emitting substance contained in the light-emitting unit emits light. The electrons injected into the light-emitting unit provided on the anode side are recombined with the holes injected from the anode side, so that a light-emitting substance contained in the light-emitting unit emits light. Thus, the holes and electrons generated in the intermediate layer 1104 cause light emission in the respective light-emitting units.

Note that the light-emitting units can be provided in contact with each other when these light-emitting units allow the same structure as the intermediate layer to be formed therebetween. Specifically, when one surface of the light-emitting unit is provided with a charge generation region, the charge generation region functions as a first charge generation region of the intermediate layer; thus, the light-emitting units can be provided in contact with each other.

Structure Examples 1 to 3 of the light-emitting element can be implemented in combination. For example, an intermediate layer may be provided between the cathode and the light-emitting unit in Structure Example 3 of the light-emitting element.

<Structure Including Microresonator>

Note that a microresonator (microcavity) composed of a reflective film and a semi-transmissive and semi-reflective film overlapping with the reflective film may be placed so as to sandwich a light-emitting element. By placing the light-emitting element in the microresonator, interference of light emitted from the light-emitting element occurs, so that light of a specific color can be efficiently extracted.

Note that the semi-transmissive and semi-reflective film in this specification refers to a film transmitting and reflecting part of incident light. Furthermore, the semi-transmissive and semi-reflective film used for the microresonator preferably absorbs less light.

The wavelength of extracted light depends on the distance between the reflective film and the semi-transmissive and semi-reflective film. An optical adjustment layer for adjusting the distance between the reflective film and the semi-transmissive and semi-reflective film may be provided in the light-emitting element in some cases.

A conductive film having a light-transmitting property to visible light or an EL layer can be employed for a material that can be used for the optical adjustment layer.

For example, a stacked-layer film including a conductive film with a light-transmitting property and a reflective film, or a stacked-layer film including a conductive film with a light-transmitting property and a semi-transmissive and semi-reflective film can be used as a lower electrode or an upper electrode that also serves as the optical adjustment layer.

An interlayer whose thickness is adjusted may be used as the optical adjustment layer. Alternatively, a region whose thickness is adjusted and which contains a substance having a high hole-transport property and an acceptor substance with respect to the substance having a high hole-transport property can be used for the optical adjustment layer. The electric resistance of this component is lower than that of other components included in the EL layer. Thus, even if the thickness is increased for optical adjustment, this structure is preferable because an increase in driving voltage of a light-emitting element can be suppressed.

<Material for Light-Emitting Element>

Next, specific materials that can be used for the light-emitting elements having the above structures will be described; materials for the anode, the cathode, and the EL layer will be described in that order.

<<1. Material for Anode>>

The anode 1101 is formed with a single-layer structure or a stacked structure using any of a metal, an alloy, an electrically conductive compound, and a mixture thereof that have conductivity. In particular, a structure is preferred in which a material having a high work function (specifically, 4.0 eV or higher) is in contact with the EL layer.

Examples of the metal or the alloy material are metal materials such as gold (Au), platinum (Pt), nickel (Ni), tungsten (W), chromium (Cr), molybdenum (Mo), iron (Fe), cobalt (Co), copper (Cu), palladium (Pd), and titanium (Ti) and alloy materials thereof.

Examples of the electrically conductive compound include an oxide of a metal material, a nitride of a metal material, and a conductive polymer.

Specific examples of the oxide of a metal material include indium tin oxide (ITO), indium tin oxide containing silicon or silicon oxide, indium tin oxide containing titanium, indium titanium oxide, indium tungsten oxide, indium zinc oxide, and indium zinc oxide containing tungsten. Specific examples of the oxide of a metal material further include molybdenum oxide, vanadium oxide, ruthenium oxide, tungsten oxide, manganese oxide, titanium oxide, and the like.

A film of the oxide of a metal material is usually formed by a sputtering method, but may be formed by application of a sol-gel method or the like.

Specific examples of the nitride of a metal material include titanium nitride, tantalum nitride, and the like.

Specific examples of the conductive polymer include poly (3,4-ethylenedioxythiophene)/poly(styrenesulfonic acid) (PEDOT/PSS), polyaniline/poly(styrenesulfonic acid) (PAni/PSS), and the like.

Note that in the case where the second charge generation region is provided in contact with the anode 1101, a variety of electrically conductive materials can be used for the anode 1101 regardless of their work functions. Specifically, besides a material that has a high work function, a material that has a low work function can also be used. A material that can be used for the second charge generation region and the first charge generation region will be described later.

<<2. Material for Cathode>>

In the case where the first charge generation region 1104c is provided between the cathode 1102 and the light-emitting unit 1103 to be in contact with the cathode 1102, a variety of conductive materials can be used for the cathode 1102 regardless of their work functions.

Note that at least one of the cathode 1102 and the anode 1101 is formed using a conductive film that transmits visible light. For example, when one of the cathode 1102 and the anode 1101 is formed using a conductive film that transmits visible light and the other is formed using a conductive film that reflects visible light, a light-emitting element that emits light from one side can be formed. Alternatively, when both the cathode 1102 and the anode 1101 are formed using conductive films that transmit visible light, a light-emitting element that emits light from both sides can be formed.

Examples of the electrically conductive film that transmits visible light are a film of indium tin oxide, a film of indium tin oxide containing silicon or silicon oxide, a film of indium tin oxide containing titanium, a film of indium titanium oxide, a film of indium tungsten oxide, a film of indium zinc oxide, and a film of indium zinc oxide containing tungsten. Furthermore, a metal thin film whose thickness is set so that light is transmitted (preferably, thickness approximately greater than or equal to 5 nm and less than or equal to 30 nm) can also be used.

For the conductive film that reflects visible light, a metal is used, for example. Specific examples thereof include metal materials such as silver, aluminum, platinum, gold, and copper, and an alloy material containing any of these. Examples of the alloy containing silver include a silver-neodymium alloy and a magnesium-silver alloy. As examples of the alloy of aluminum, an aluminum-nickel-lanthanum alloy, an aluminum-titanium alloy, and an aluminum-neodymium alloy can be given.

<<3. Material for EL Layer>>

Specific examples of materials for the layers included in the light-emitting unit 1103 will be given below.

The hole-injection layer is a layer containing a substance having a high hole-injection property. As the substance having a high hole-injection property, for example, a molybdenum oxide, a vanadium oxide, a ruthenium oxide, a tungsten oxide, a manganese oxide, or the like can be used. Alternatively, the hole-injection layer can be formed with a phthalocyanine compound such as phthalocyanine ($H_2Pc$) or copper phthalocyanine (CuPc), a polymeric compound such as poly(3,4-ethylenedioxythiophene)/poly(styrenesulfonic acid) (PEDOT/PSS), or the like.

Note that the hole-injection layer may be formed using the second charge generation region. When the second charge generation region is used for the hole-injection layer, a variety of conductive materials can be used for the anode 1101 regardless of their work functions as described above. Materials for forming the second charge generation region will be described later together with materials for forming the first charge generation region.

<<3.1. Hole-Transport Layer>>

The hole-transport layer is a layer containing a substance having a high hole-transport property. The hole-transport layer may have a stacked layer of two or more layers containing a substance having a high hole-transport property without limitation to a single layer. A substance having a hole-transport property higher than an electron-transport property is used. In particular, a substance having a hole mobility of $10^{-6}$ $cm^2$/Vs or higher is preferably used, in which case the driving voltage of the light-emitting element can be reduced.

As the substance having a high hole-transport property, an aromatic amine compound such as 4,4'-bis[N-(1-naphthyl)-N-phenylamino]biphenyl (abbreviation: NPB or α-NPD), or a carbazole derivative such as 9-[4-(10-phenyl-9-anthracenyl)phenyl]-9H-carbazole (abbreviation: CzPA) can be given. Furthermore, a polymeric compound (e.g., poly(N-vinylcarbazole) (abbreviation: PVK)), or the like can be used.

<<3.2. Light-Emitting Layer>>

The light-emitting layer is a layer containing a light-emitting substance. The light-emitting layer may have a stacked layer including two or more layers containing a light-emitting substance without limitation to a single layer. A fluorescent compound or a phosphorescent compound can be used as the light-emitting substance. A phosphorescent compound is preferably used as the light-emitting substance, in which case the emission efficiency of the light-emitting element can be increased.

As the light-emitting substance, a fluorescent compound (e.g., coumarin 545T) or a phosphorescent compound (e.g., tris(2-phenylpyridinato)iridium(III) (abbreviation: Ir(ppy)$_3$)) can be used, for example.

Those light-emitting substances are preferably dispersed in a host material. A host material preferably has higher excitation energy than the light-emitting substance.

As the material that can be used as the host material, the above-described substance having a high hole-transport property (e.g., an aromatic amine compound, a carbazole derivative, and a polymeric compound), a substance having a high electron-transport property (e.g., a metal complex having a quinoline skeleton or a benzoquinoline skeleton and a metal complex having an oxazole-based ligand or a thiazole-based ligand), which will be described later, or the like can be used.

<<3.3. Electron-Transport Layer>>

The electron-transport layer is a layer containing a substance having a high electron-transport property. The electron-transport layer may have a stacked layer of two or more layers containing a substance having a high electron-transport property without limitation to a single layer. A substance having an electron-transport property higher than a hole-transport property is used. In particular, a substance having an electron mobility of $10^{-6}$ $cm^2$/Vs or higher is preferably used, in which case the driving voltage of the light-emitting element can be reduced.

As the substance having a high electron-transport property, a metal complex having a quinoline skeleton or a benzoquinoline skeleton (e.g., tris(8-quinolinolato)aluminum (abbreviation: Alq)), a metal complex having an oxazole-based or thiazole-based ligand (e.g., bis[2-(2-hydroxyphenyl)benzoxazolato]zinc (abbreviation: Zn(BOX)$_2$)), or another compound (e.g., bathophenanthroline (abbreviation: BPhen)) can be used. Furthermore, a polymeric compound (e.g., poly[(9,9-dihexylfluorene-2,7-diyl)-co-(pyridine-3,5-diyl)] (abbreviation: PF-Py)) or the like can be used.

<<3.4. Electron-Injection Layer>>

The electron-injection layer is a layer containing a substance having a high electron-injection property. The electron-injection layer may have a stacked layer including two or more layers containing a substance having a high electron-injection property without limitation to a single layer. The electron-injection layer is preferably provided, in which case the efficiency of electron injection from the cathode 1102 can be increased, so that the driving voltage of the light-emitting element can be reduced.

As the substance having a high electron-injection property, an alkali metal (e.g., lithium (Li), or cesium (Cs)), an alkaline earth metal (e.g., calcium (Ca)), a compound of such a metal (e.g., oxide (specifically, lithium oxide, or the like), a carbonate (specifically, lithium carbonate, cesium carbonate, or the like), a halide (specifically, lithium fluoride (LiF), cesium fluoride (CsF), or calcium fluoride (CaF$_2$)), or the like can be given.

Alternatively, the layer containing a high electron-injection property may be a layer containing a substance with a high electron-transport property and a donor substance (specifically, a layer made of Alq containing magnesium (Mg)). Note that the mass ratio of the added donor substance to the substance having a high electron-transport property is preferably 0.001:1 to 0.1:1.

As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal.

<<3.5. Charge Generation Region>>

The first charge generation region 1104c and the second charge generation region are regions containing a substance having a high hole-transport property and an acceptor substance. The charge generation region is not limited to a structure in which a substance having a high hole-transport property and an acceptor substance are contained in the same film, and may have a structure in which a layer containing a substance having a high hole-transport property and a layer containing an acceptor substance are stacked. Note that in the case of a stacked-layer structure in which the first charge generation region is provided on the cathode side, the layer containing the substance having a high hole-transport property is in contact with the cathode 1102, and in the case of a stacked-layer structure in which the second charge generation region is provided on the anode side, the layer containing an acceptor substance is in contact with the anode 1101.

Note that the acceptor substance is preferably added to the charge generation region so that the mass ratio of the acceptor substance to the substance having a high hole-transport property is from 0.1:1 to 4.0:1.

As the acceptor substance that is used for the charge generation region, a transition metal oxide and an oxide of a metal belonging to any of Groups 4 to 8 of the periodic table can be given. Specifically, molybdenum oxide is particularly preferable. Note that molybdenum oxide has a low hygroscopic property.

As the substance having a high hole-transport property that is used for the charge generation region, any of a variety of organic compounds such as an aromatic amine compound, a carbazole derivative, an aromatic hydrocarbon, and a polymeric compound (such as an oligomer, a dendrimer, or a polymer) can be used. Specifically, use of a substance having a hole mobility greater than or equal to $10^{-6}$ cm$^2$/Vs is preferable. However, any other substances may also be used as long as the hole-transport property thereof is higher than the electron-transport property thereof.

<<Electron-Relay Layer>>

The electron-relay layer 1104b is a layer that can immediately receive electrons extracted by the acceptor substance in the first charge generation region 1104c. Therefore, the electron-relay layer 1104b is a layer containing a substance having a high electron-transport property, and the LUMO level of the electron-relay layer 1104b is positioned between the acceptor level of the acceptor substance in the first charge generation region 1104c and the LUMO level of the light-emitting unit 1103 with which the electron-relay layer is in contact. Specifically, the LUMO level of the electron-relay layer 1104b is preferably approximately greater than or equal to −5.0 eV and less than or equal to −3.0 eV.

As the substance used for the electron-relay layer 1104b, a perylene derivative (e.g., 3,4,9,10-perylenetetracarboxylic dianhydride (abbreviation: PTCDA)), a nitrogen-containing condensed aromatic compound (e.g., pyrazino[2,3-f][1,10] phenanthroline-2,3-dicarbonitrile (abbreviation: PPDN)), or the like can be given.

Note that a nitrogen-containing condensed aromatic compound is preferably used for the electron-relay layer 1104b because of its stability. Among nitrogen-containing condensed aromatic compounds, a compound having an electron-withdrawing group such as a cyano group or a fluoro group is preferably used, in which case electrons can be received more easily in the electron-relay layer 1104b.

<<Electron-injection Buffer>>

An electron-injection buffer is a layer containing a substance having a high electron-injection property. The electron-injection buffer 1104a is a layer that facilitates electron injection from the first charge generation region 1104c into the light-emitting unit 1103. By providing the electron-injection buffer 1104a between the first charge generation region 1104c and the light-emitting unit 1103, the injection barrier therebetween can be reduced.

As the substance having a high electron-injection property, an alkali metal, an alkali earth metal, a rare earth metal, a compound of these metals, or the like can be given.

Furthermore, the layer containing a substance having a high electron-injection property may be a layer containing a substance having a high electron-transport property and a donor substance.

<Method for Fabricating Light-Emitting Element>

A method for fabricating the light-emitting element will be described. Over the lower electrode, the layers described above are combined as appropriate to form the EL layer. Any of a variety of methods (e.g., a dry process or a wet process) can be used for the EL layer depending on the material for the EL layer. For example, a vacuum evaporation method, a transfer method, a printing method, an inkjet method, a spin coating method, or the like may be selected. Note that a different formation method may be employed for each layer. The upper electrode is formed over the EL layer. In this manner, the light-emitting element is fabricated.

The light-emitting element described in this embodiment can be fabricated by combining the above materials. Light emission from the above light-emitting substance can be obtained with this light-emitting element, and the emission color can be selected by changing the type of the light-emitting substance.

Furthermore, when a plurality of light-emitting substances that emit light of different colors are used, the width of the emission spectrum can be expanded, whereby, for example, white light emission can be obtained. In order to obtain white light emission, for example, a structure may be employed in which at least two layers containing light-emitting substances are provided so that light of complementary colors is emitted. Specific examples of complementary colors are a combination of blue and yellow, a combination of blue-green and red, and the like.

Furthermore, in order to obtain white light emission with an excellent color rendering property, an emission spectrum is preferred to spread through the entire visible light region. For example, a light-emitting element may include layers emitting light of blue, green, and red.

This embodiment can be combined with any of the other embodiments in this specification as appropriate.

Embodiment 6

In this embodiment, an electronic device of one embodiment of the present invention will be described with reference to FIGS. 11A to 11F.

The electronic devices of embodiments of the present invention each include a display portion having a light-emitting module of one embodiment of the present invention and can display an image on the display portion. For example, video data broadcasted or distributed or video data stored in a data storage medium can be displayed. Furthermore, data processed by a data processing device can be displayed. Furthermore, an image used for operation of a control panel or the like can be displayed.

Examples of an electronic device displaying video data include a television device and a digital photo frame.

Examples of the data processing device include a computer, a digital camera, a digital video camera, and a portable information terminal.

Other examples of an electronic device include a watch, a mobile phone, a portable game machine, a large-scale game machine (e.g., a pachinko machine), and an audio reproducing device.

<Television Device>

Figure 11A:
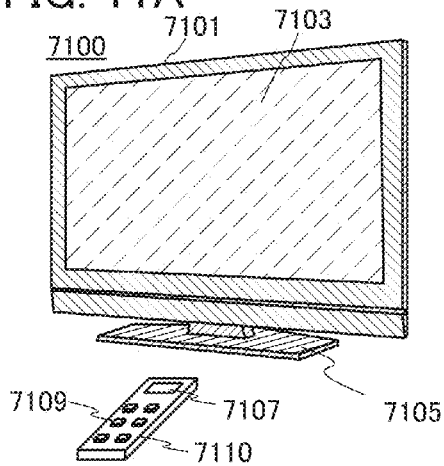
FIGS. 11A to 11F are views each illustrating an electronic device.

A television device 7100 includes a display portion 7103 incorporated in a housing 7101 supported by a stand 7105 (see FIG. 11A). The display portion 7103 including the light-emitting module of one embodiment of the present invention can display images.

A remote controller 7110 can control the television device 7100. For example, video data displayed on the display portion 7103 can be switched, and volume can be adjusted.

The remote controller 7110 includes a data input and output panel 7107, an operation key 7109, and the like.

An image displayed on the display portion 7103 is supplied from a receiver or a modem for receiving data broadcasted or distributed.

The television device 7100 may be connected to the Internet to perform two-way (e.g., between a sender and a receiver or between receivers) communication of data.

<Data Processing Device>

Figure 11B:
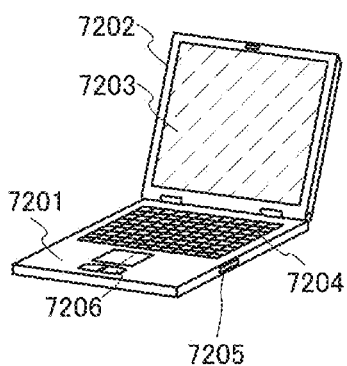

FIG. 11B illustrates a computer as an example of the data processing device. The computer includes a main body 7201, a housing 7202, a display portion 7203, a keyboard 7204, an external connection port 7205, a pointing device 7206, and the like. The display portion 7203 including the light-emitting module of one embodiment of the present invention can display images.

<Game Machine>

Figure 11C:
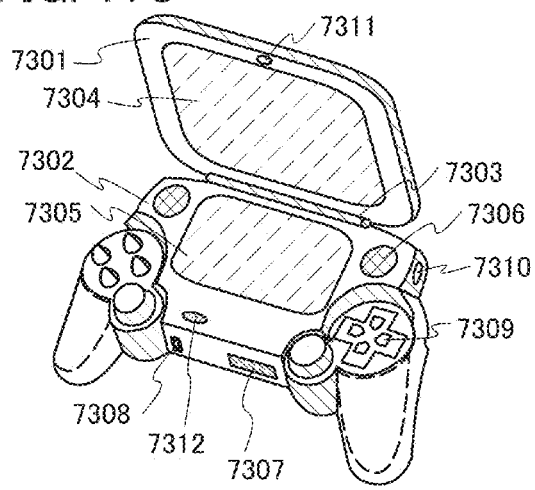

FIG. 11C illustrates an example of a portable game machine. A portable game machine illustrated as an example includes two housings, a housing 7301 and a housing 7302, which are jointed with a joint portion 7303 so that the portable game machine can be opened or folded. A first display portion 7304 is incorporated in the housing 7301 and a second display portion 7305 is incorporated in the housing 7302. The first display portion 7304 and the second display portion 7305 including the light-emitting module of one embodiment of the present invention can display images.

In addition, the portable game machine includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like.

The portable game machine has a function of reading a program or data stored in a recording medium to display it on the first display portion 7304 and the second display portion 7305, and a function of sharing information with another portable game machine by wireless communication.

<Mobile Phone>

Figure 11D:
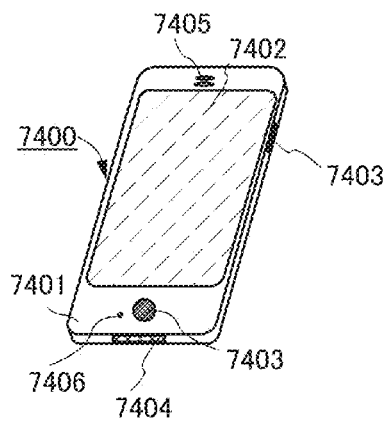

FIG. 11D illustrates an example of a mobile phone. A mobile phone 7400 is provided with a display portion 7402 incorporated in a housing 7401, an operation button 7403, an external connection port 7404, a speaker 7405, a microphone 7406, and the like. The display portion 7402 including the light-emitting module of one embodiment of the present invention can display images.

The display portion 7402 includes a proximity sensor; thus, data can be input when a finger or the like touches or approaches the display portion 7402.

When a sensing device including a sensor such as a gyroscope or an acceleration sensor for sensing inclination is provided, display on the screen of the display portion 7402 can be automatically changed in direction by determining the orientation of the mobile phone 7400 (whether the mobile phone 7400 is placed horizontally or vertically for a landscape mode or a portrait mode).

The display portion 7402 can function as a two-dimensional image sensor. In that case, images of a palm print and a fingerprint of a hand that touches the display portion 7402, images of a palm vein and a finger vein that can be taken using a backlight or a sensing light source emitting near-infrared light, and the like can be used for personal authentication, for example.

<Portable Information Terminal>

Figure 11E:
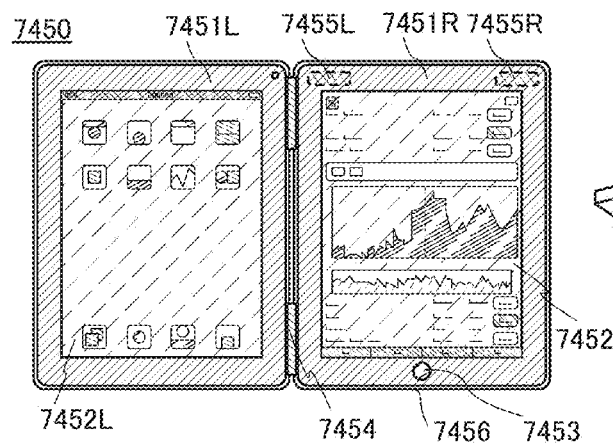

FIG. 11E illustrates an example of a foldable portable information terminal. A portable information terminal 7450 includes a housing 7451L and a housing 7451R connected by hinges 7454. The portable information terminal 7450 further includes an operation button 7453, a left speaker 7455L, and a right speaker 7455R. In addition, a side surface of the portable information terminal 7450 is provided with an external connection port 7456, which is not illustrated. Note that when the portable information terminal 7450 is folded on the hinges 7454 so that a display portion 7452L provided in the housing 7451L and a display portion 7452R provided in the housing 7451R can face each other, the two display portions can be protected by the housings. The display portion 7452L and the display portion 7452R including the light-emitting module of one embodiment of the present invention can display images.

Furthermore, the portable information terminal 7450 can also include a gyroscope, an acceleration sensor, a global positioning system (GPS) receiver, or a video camera. For example, when a sensing device including a sensor for sensing inclination, such as a gyroscope or an acceleration sensor, is provided, display on the screen can be automatically changed by determining the orientation of the portable information terminal 7450 (whether the portable information terminal 7450 is placed horizontally or vertically).

Furthermore, the portable information terminal 7450 can be connected to a network. The portable information terminal 7450 not only can display data on the Internet but also can be used as a terminal that controls another electronic device connected to the network from a distant place.

<Lighting Device>

Figure 11F:
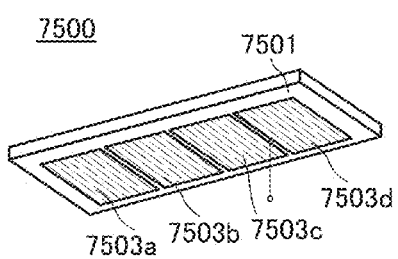

FIG. 11F illustrates an example of a lighting device. A lighting device 7500 includes light-emitting devices 7503a, 7503b, 7503c, and 7503d incorporated in a housing 7501. The lighting device 7500 can be attached to a ceiling, a wall, or the like. Furthermore, the lighting device 7500 includes a light-emitting module of one embodiment of the present invention.

This embodiment can be combined with any of the other embodiments in this specification as appropriate.

Example 1

In this example, a method for fabricating a protrusion and a partition that can be used for a light-emitting panel of one embodiment of the present invention will be described with reference to FIGS. 13A1 to 13D1 and FIGS. 13A2 to 13D2 and FIGS. 14A and 14B.

Note that FIGS. 13A1 to 13D1 each show a cross section along the cutting plane line X1-X2 in the top view of FIG. 3A, and FIGS. 13A2 to 13D2 each show a cross section along the cutting plane line Y1-Y2 in the top view of FIG. 3A.

FIGS. 13A1 to 13D1 and FIGS. 13A2 to 13D2 are cross-sectional views illustrating a method for fabricating a protrusion and a partition that can be used for a light-emitting panel of one embodiment of the present invention. Specifically, a method for fabricating a protrusion 225F and a partition 228F is illustrated. Note that the method for fabricating the protrusion and partition that was practiced in this example can be regarded as a modification example of the method for fabricating the protrusion and partition that is described in Embodiment 3.

Figure 14A:
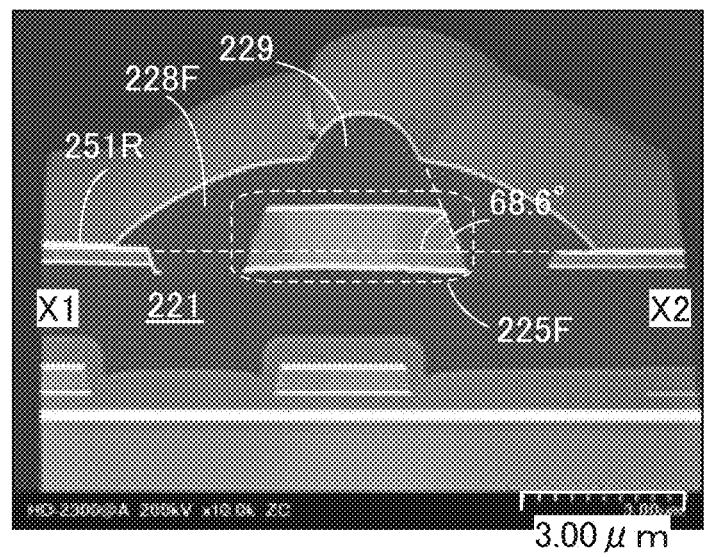
FIGS. 14A and 14B are electron micrographs showing a protrusion and a partition that are applicable to a light-emitting panel.
Figure 14B:
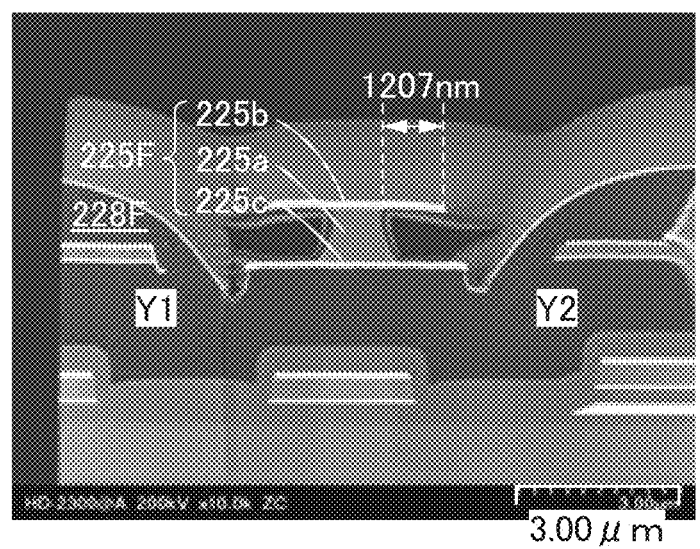

FIGS. 14A and 14B are photographs showing scanning transmission electron microscope images (Z-contrast images) of cross sections of the protrusion 225F and the partition 228F, which were fabricated by the method described with reference to FIGS. 13A1 to 13D1 and FIGS. 13A2 to 13D2.

In this example, the protrusion 225F and the partition 228F were fabricated over the insulating surface 221 of an insulating film of a pixel circuit that had been formed over a glass substrate. Note that unshown opening portions for electrically connecting the pixel circuits and lower electrodes were provided in the insulating film.

<First Step>

The reflective films 251 were formed in the first step.

Specifically, by a sputtering method, a 50-nm-thick titanium film, a 200-nm-thick aluminum film, and a 5-nm-thick titanium film were stacked in that order over the insulating surface 221 of the insulating film and in the unshown opening portions.

A resist mask was formed and an unnecessary portion was removed by a dry etching method, whereby the reflective films 251 were formed. Note that the reflective films 251 were electrically connected to the pixel circuits in the unshown opening portions and can supply power to the lower electrodes that were formed later.

<Second Step>

In the second step, the protective film 223 was formed to cover the reflective films 251 (see FIGS. 13A1 and 13A2).

Note that the protective film 223 was a film for protecting the reflective films 251 in the third step for forming the protrusion 225F.

Specifically, a 100-nm-thick film of indium tin oxide containing silicon was formed by a sputtering method to cover the reflective films 251 and was partly removed by an etching method using a resist mask in a portion where the protrusion was to be formed.

<Third Step>

In the third step, a protrusion with a sloping sidewall was formed over the protective film 223 (see FIGS. 13B1 and 13B2).

Specifically, by a sputtering method, a 100-nm-thick titanium film, a 1000-nm-thick aluminum film, and a 100-nm-thick titanium film were stacked in that order over the protective film 223.

A resist mask was formed and an unnecessary portion of the films reflecting visible light was removed by an etching method, so that the protrusion 225F with a sloping sidewall was formed. Note that the protrusion 225F had a structure in which the titanium film 225c, the aluminum film 225a, and the titanium film 225b were stacked in that order.

Then, the resist mask was removed, which was followed by removal of the protective film 223.

<Fourth Step>

In the fourth step, the lower electrodes were formed.

Specifically, with the use of films of indium tin oxide containing silicon, the first lower electrode 251R with a thickness of 82 nm, the second lower electrode 251G with a thickness of 45 nm, and the unshown third lower electrode with a thickness of 5 nm were formed.

Note that the films of indium tin oxide containing silicon were formed over the reflective films 251 by a sputtering method, and unnecessary portions were removed by an etching method using a resist mask.

<Fifth Step>

In the fifth step, the light-transmitting partition 228F was formed to overlap with the end portions of the lower electrodes and the sidewall of the protrusion 225F. The spacer 229 was also formed to overlap with the partition 228F (see FIGS. 13C1 and 13C2).

Specifically, a film containing a photosensitive polyimide was formed; then, opening portions were formed in positions overlapping with the first lower electrode 251R, the second lower electrode 251G, the unshown third lower electrode, and the protrusion 225F.

Note that the thickness of the partition 228F was set to 1.5 μm. The spacer 229 was formed using the same material as the partition 228F to reach a height of 2.0 μm.

<Sixth Step>

In the sixth step, the wide portion 225W and the narrow portion 225N were formed in the protrusion 225F (see FIGS. 6D1 and 6D2).

A resist mask (not shown) was formed to protect a portion other than the protrusion 225F provided in the opening portion. The aluminum film 225a of the protrusion 225F in the opening portion was selectively wet-etched using an etchant containing a nitric acid and a phosphoric acid.

Thus, the wide portion 225W including the titanium film 225b, which is not easily etched, and the narrow portion 225N including the aluminum film 225a were formed in the protrusion 225F. After that, the resist mask was removed.

FIGS. 14A and 14B are photographs showing scanning transmission electron microscope images (Z-contrast images) of cross sections of the protrusion 225F and the partition 228F, which were fabricated by the method involving the above-described first to sixth steps.

As is shown in the photograph, the protrusion 225F with the sidewall sloping toward the lower electrode at an angle of 68.6° was formed.

In addition, the wide portion that extended 1207 nm beyond an edge of the narrow portion to form an eaves shape was formed.

Example 2

In this example, a protrusion and a partition that can be used for a light-emitting panel of one embodiment of the present invention will be described with reference to FIGS. 15A and 15B. Specifically, a protrusion and a partition with the structures in the modification example 4 in Embodiment 2 that were fabricated in this example will be described.

Figure 15A:
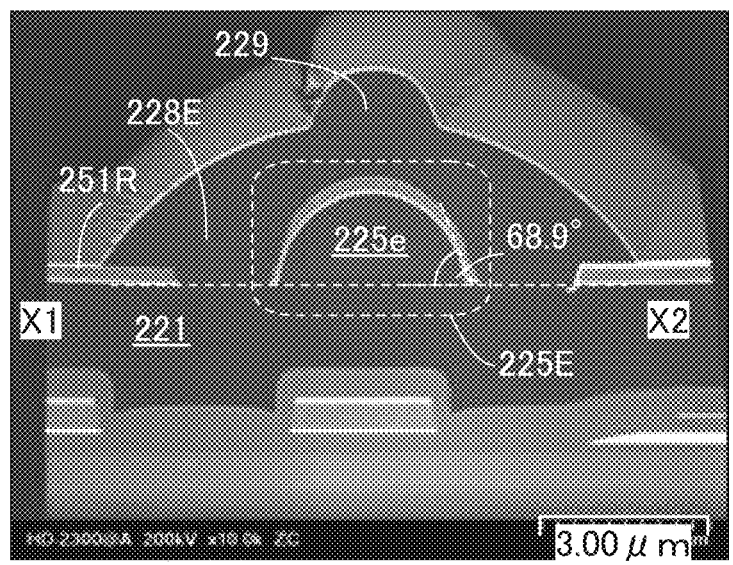
FIGS. 15A and 15B are electron micrographs showing a protrusion and a partition that are applicable to a light-emitting panel.
Figure 15B:
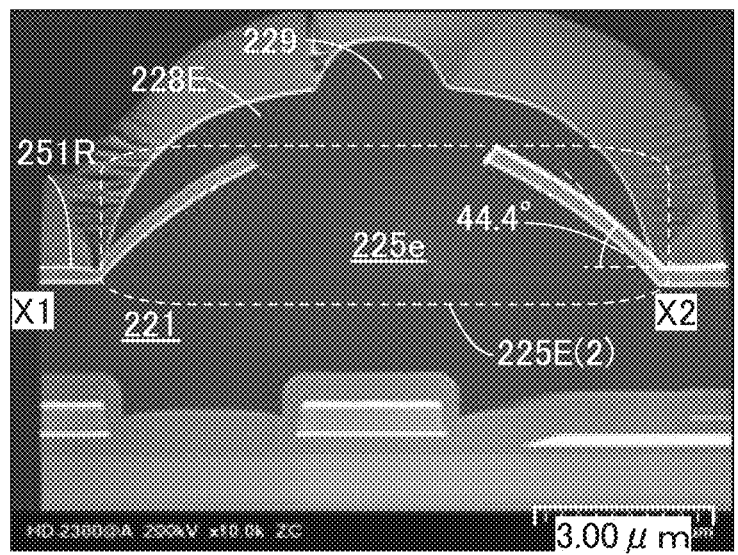

Note that FIGS. 15A and 15B are scanning transmission electron microscope images (Z-contrast images) of cross sections of the protrusion and the partition fabricated in this example.

In this example, the partition 228E and the protrusion 225E or 225E(2) were fabricated over the insulating surface 221E of an insulating film of a pixel circuit that had been formed over a glass substrate. Note that the core portion 225e was formed using a photosensitive polyimide.

As is shown in the photograph, the protrusion 225E with the sidewall sloping toward the lower electrode at an angle of 68.9° was formed (see FIG. 15A). Furthermore, the protrusion 225E with the sidewall sloping toward the lower electrode at an angle of 44.4° was formed (see FIG. 15B). As described above, when the core portion 225e of the protrusion includes a resin, the protrusion can have a sidewall sloping at a desired angle.

This application is based on Japanese Patent Application serial no. 2013-083512 filed with Japan Patent Office on Apr. 12, 2013, the entire contents of which are hereby incorporated by reference.

What is claimed is:

1. A light-emitting device comprising:
   an insulating surface;
   a lower electrode over the insulating surface;
   a protrusion over the insulating surface, the protrusion comprising a sidewall sloping toward the lower electrode;
   a partition overlapping with an end portion of the lower electrode and the sidewall of the protrusion;
   a light-emitting element comprising:
      the lower electrode;
      an upper electrode overlapping with the lower electrode; and
      a layer comprising a light-emitting organic compound between the lower electrode and the upper electrode; and
   a counter substrate over the light-emitting element,
   wherein the sidewall of the protrusion reflects light emitted from the light-emitting element,
   wherein the protrusion is provided between the insulating surface and the partition, and
   wherein the protrusion and the lower electrode are not overlapped with each other.

2. The light-emitting device according to claim 1, wherein the sidewall of the protrusion comprises a surface sloping toward the lower electrode at an angle greater than or equal to 30° and less than or equal to 75°.

3. The light-emitting device according to claim 1,
   wherein the lower electrode comprises a reflective film, and
   wherein the sidewall of the protrusion comprises the same material as the reflective film.

4. The light-emitting device according to claim 1, wherein the partition comprises a material with a refractive index lower than a refractive index of the layer comprising the light-emitting organic compound.

5. The light-emitting device according to claim 1, further comprising:
   an optical bonding layer between the light-emitting element and the counter substrate,
   wherein the optical bonding layer comprises a material with a refractive index higher than a refractive index of a material contained in the partition.

6. The light-emitting device according to claim 1, further comprising:
   a transistor over a substrate; and
   an insulating film over the transistor,
   wherein the insulating surface is a top surface of the insulating film.

7. The light-emitting device according to claim 1,
   wherein the protrusion comprises a narrow portion and a wide portion,
   wherein the narrow portion is formed between the insulating surface and the wide portion, and
   wherein the narrow portion comprises the sidewall.

8. A light-emitting device comprising:
   an insulating surface;
   a first lower electrode and a second lower electrode over the insulating surface;
   a protrusion over the insulating surface, the protrusion comprising:
      a first sidewall sloping toward the first lower electrode; and
      a second sidewall sloping toward the second lower electrode;
   a partition overlapping with an end portion of the first lower electrode, the first sidewall, an end portion of the second lower electrode, and the second sidewall;
   a first light-emitting element comprising:
      the first lower electrode;
      an upper electrode overlapping with the first lower electrode; and
      a layer comprising a light-emitting organic compound between the first lower electrode and the upper electrode;
   a second light-emitting element comprising:
      the second lower electrode;
      the upper electrode overlapping with the second lower electrode; and
      the layer comprising the light-emitting organic compound between the second lower electrode and the upper electrode; and
   a counter substrate over the first light-emitting element and the second light-emitting element,
   wherein the first sidewall and the second sidewall reflect light emitted from the first light-emitting element and light emitted from the second light-emitting element, respectively,
   wherein the protrusion is provided between the insulating surface and the partition,
   wherein the protrusion and the first lower electrode are not overlapped with each other, and
   wherein the protrusion and the second lower electrode are not overlapped with each other.

9. The light-emitting device according to claim 8,
   wherein the first sidewall comprises a first surface sloping toward the first lower electrode at an angle greater than or equal to 30° and less than or equal to 75°, and
   wherein the second sidewall comprises a second surface sloping toward the second lower electrode at an angle greater than or equal to 30° and less than or equal to 75°.

10. The light-emitting device according to claim 8,
    wherein the first lower electrode comprises a first reflective film,
    wherein the second lower electrode comprises a second reflective film,
    wherein the first reflective film and the second reflective film are formed from a reflective film, and
    wherein the first sidewall and the second sidewall comprise the same material as the reflective film.

11. The light-emitting device according to claim 8, wherein the partition comprises a material with a refractive index lower than a refractive index of the layer comprising the light-emitting organic compound.

12. The light-emitting device according to claim 8, further comprising:
    an optical bonding layer between the first light-emitting element and the counter substrate and between the second light-emitting element and the counter substrate, wherein the optical bonding layer comprises a material with a refractive index higher than a refractive index of a material contained in the partition.

13. The light-emitting device according to claim 8, further comprising:
a transistor over a substrate, and
an insulating film over the transistor,
wherein the insulating surface is a top surface of the insulating film.

14. The light-emitting device according to claim 8,
wherein the protrusion comprises a narrow portion and a wide portion,
wherein the narrow portion is formed between the insulating surface and the wide portion, and
wherein the narrow portion comprises the first sidewall and the second sidewall.

15. A light-emitting device comprising:
an insulating surface;
a first lower electrode and a second lower electrode over the insulating surface;
a conductive protrusion over the insulating surface, the conductive protrusion comprising:
   a first sidewall sloping toward the first lower electrode; and
   a second sidewall sloping toward the second lower electrode;
a partition overlapping with an end portion of the first lower electrode, the first sidewall, an end portion of the second lower electrode, and the second sidewall;
a first light-emitting element comprising:
   the first lower electrode;
   an upper electrode overlapping with the first lower electrode; and
   a layer comprising a light-emitting organic compound between the first lower electrode and the upper electrode;
a second light-emitting element comprising:
   the second lower electrode;
   the upper electrode overlapping with the second lower electrode; and
   the layer comprising the light-emitting organic compound between the second lower electrode and the upper electrode;
a counter substrate over the first light-emitting element and the second light-emitting element; and
an optical bonding layer between the first light-emitting element and the counter substrate and between the second light-emitting element and the counter substrate,
wherein the optical bonding layer comprises a material with a refractive index higher than a refractive index of a material contained in the partition,
wherein the partition comprises an opening portion overlapping with the conductive protrusion,
wherein the conductive protrusion is electrically connected to the upper electrode in the opening portion, and
wherein the first sidewall and the second sidewall reflect light emitted from the first light-emitting element and light emitted from the second light-emitting element, respectively.

16. The light-emitting device according to claim 15,
wherein the first sidewall comprises a first surface sloping toward the first lower electrode at an angle greater than or equal to 30° and less than or equal to 75°, and
wherein the second sidewall comprises a second surface sloping toward the second lower electrode at an angle greater than or equal to 30° and less than or equal to 75°.

17. The light-emitting device according to claim 15,
wherein the first lower electrode comprises a first reflective film,
wherein the second lower electrode comprises a second reflective film,
wherein the first reflective film and the second reflective film are formed from a reflective film, and
wherein the first sidewall and the second sidewall comprise the same material as the reflective film.

18. The light-emitting device according to claim 15, wherein the partition comprises a material with a refractive index lower than a refractive index of the layer comprising the light-emitting organic compound.

19. The light-emitting device according to claim 15, further comprising:
a transistor over a substrate, and
an insulating film over the transistor,
wherein the insulating surface is a top surface of the insulating film.

20. The light-emitting device according to claim 15,
wherein the conductive protrusion comprises a narrow portion and a wide portion,
wherein the narrow portion is formed between the insulating surface and the wide portion, and
wherein the narrow portion comprises the first sidewall and the second sidewall.

* * * * *